(12) United States Patent
Yamada et al.

(10) Patent No.: US 8,345,507 B2
(45) Date of Patent: Jan. 1, 2013

(54) STORAGE DEVICE, SUBSTRATE, LIQUID CONTAINER, SYSTEM AND CONTROL METHOD OF STORAGE DEVICE

(75) Inventors: Shinichi Yamada, Nagano-ken (JP);
Yasuhiko Kosugi, Nagano-ken (JP);
Noboru Asauchi, Nagano-ken (JP);
Yoshihiro Nakamura, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 254 days.

(21) Appl. No.: 12/892,093

(22) Filed: Sep. 28, 2010

(65) Prior Publication Data
US 2011/0087853 A1 Apr. 14, 2011

(30) Foreign Application Priority Data
Oct. 14, 2009 (JP) ................................. 2009-236858

(51) Int. Cl.
*G06F 1/08* (2006.01)
*G06F 12/00* (2006.01)
*G06F 1/04* (2006.01)

(52) U.S. Cl. ................. 365/233.1; 365/189.05; 365/194; 711/167; 711/E12.001; 713/600

(58) Field of Classification Search ............. 365/189.05, 365/194, 233.1; 711/167, E12.001; 713/600
See application file for complete search history.

(56) References Cited

U.S. PATENT DOCUMENTS

| 5,604,917 | A | 2/1997 | Saito et al. |
| 6,798,707 | B2 | 9/2004 | Niwa et al. |
| 6,923,531 | B2 * | 8/2005 | Saruta ............................. 347/86 |
| 2004/0243878 | A1 * | 12/2004 | Kondo ........................... 713/600 |
| 2009/0190430 | A1 * | 7/2009 | Kang et al. .................. 365/233.5 |

FOREIGN PATENT DOCUMENTS

| JP | 58-131500 | 9/1983 |
| JP | 04-137085 | 5/1992 |
| JP | 2002-259357 | 9/2002 |
| JP | 2003-085123 | 3/2003 |
| JP | 2004-299405 | 10/2004 |

* cited by examiner

*Primary Examiner* — VanThu Nguyen
*Assistant Examiner* — Hai Pham

(57) ABSTRACT

A storage device includes a nonvolatile storage section; and a control section that controls the nonvolatile storage section, wherein the control section includes an access control section that outputs a clock for access control for performing access control of a read/write of the nonvolatile storage section, and performs access control of the read/write to the nonvolatile storage section, and a masking process section that performs the masking process of a reset signal on the basis of the clock for access control from the access control section, and supplies the reset signal after the masking process to the access control section.

12 Claims, 20 Drawing Sheets

FIG. 11A
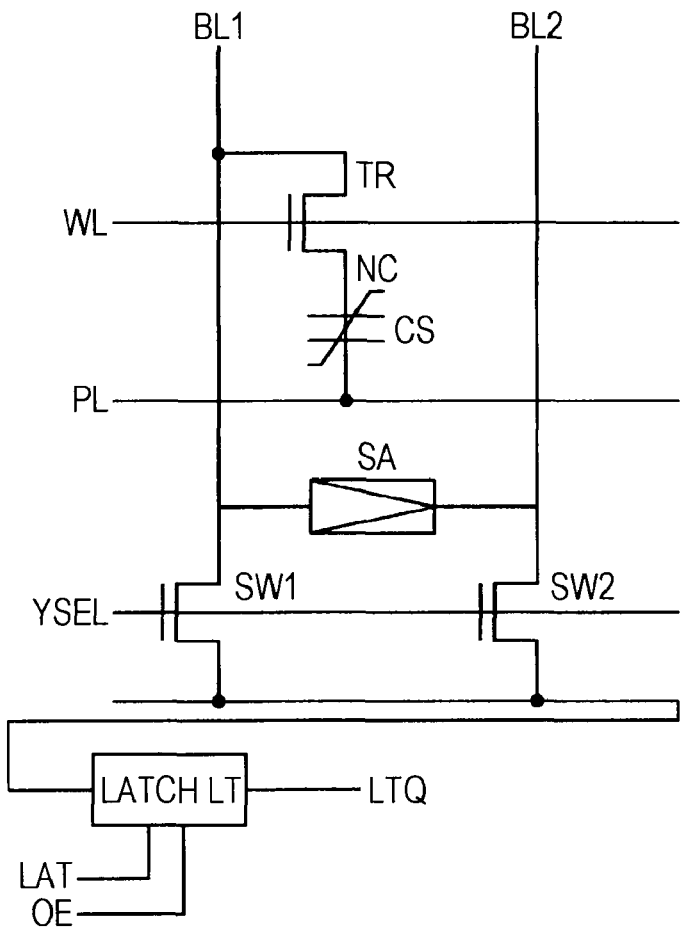
FIG. 11B
|    | "1" | "0" |
|----|-----|-----|
| BL | VCC | 0V  |
| PL | 0V  | VCC |
FIG. 11C
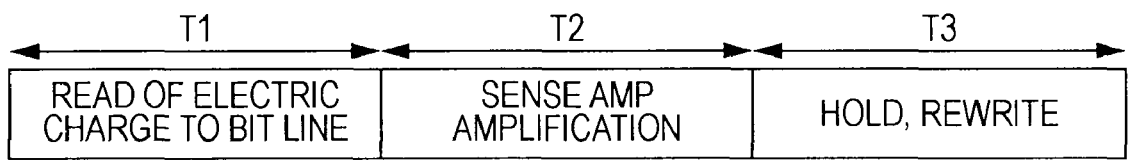

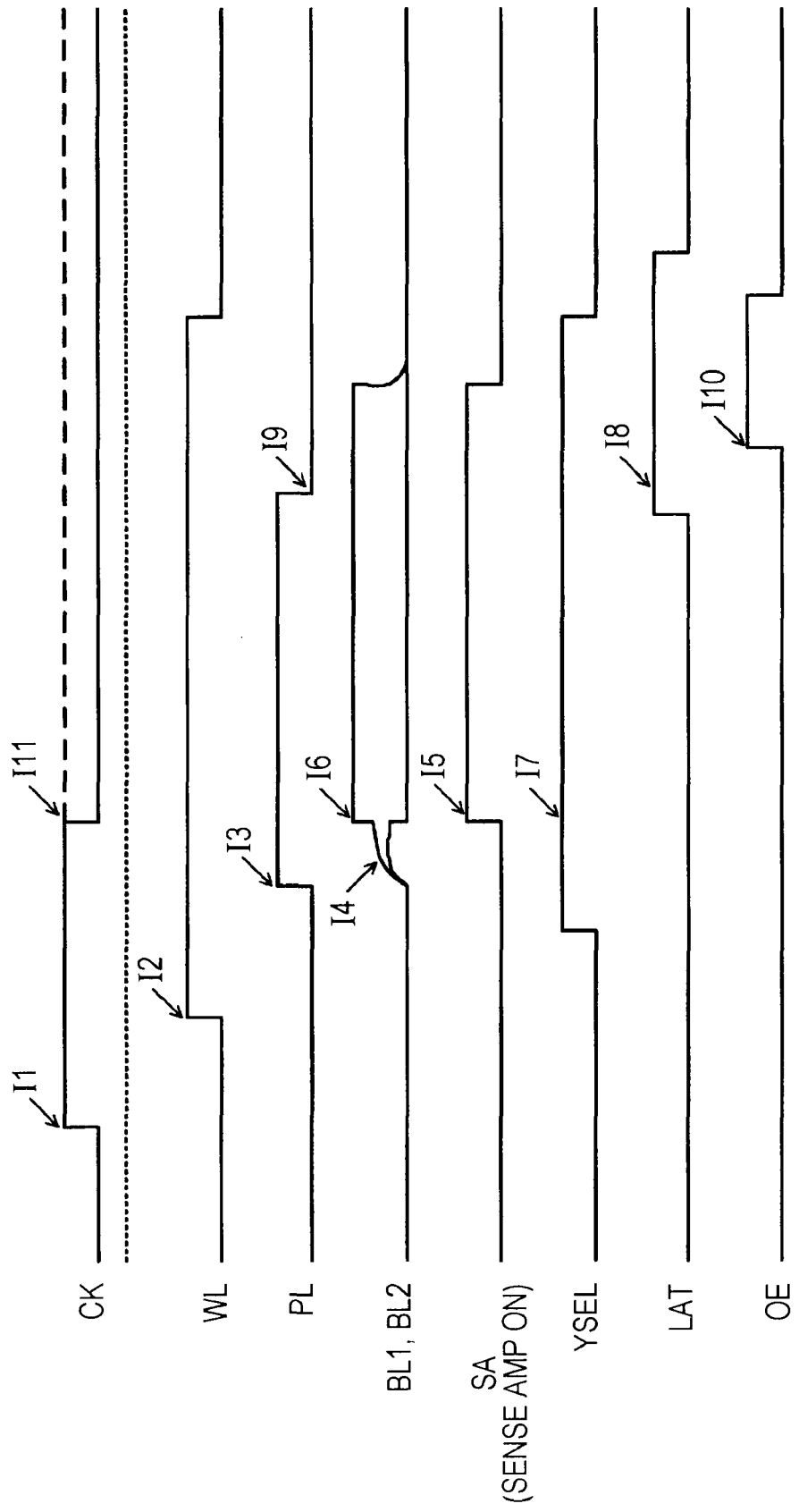

STORAGE DEVICE, SUBSTRATE, LIQUID CONTAINER, SYSTEM AND CONTROL METHOD OF STORAGE DEVICE

CROSS-REFERENCES TO RELATED APPLICATIONS

The entire disclosure of Japanese Patent Application No. 2009-236858, filed on Oct. 14, 2009 is expressly incorporated herein by reference.

BACKGROUND

1. Technical Field

The present invention relates to a storage device, a substrate, a liquid container, a system and a control method of the storage device.

2. Related Art

As a representative example of the nonvolatile memory (in a broader sense, a nonvolatile storage section) EEPROM, FERAM or the like are well known. Those memories perform transferring/receiving of data to/from a host device and perform read/write of data. For example, an ink cartridge (a liquid container) is provided in an ink jet type printer (a host device). A storage device having a nonvolatile memory is provided in the ink cartridge (For example, JP-A-2004-299405). Information such as ID, manufacturing information, remaining amount of ink or the like are stored in the nonvolatile memory, and the storage device transfers/receives this data to/from the printer.

However, in the case where a hazard is generated in signals such as a reset signal and the like, the read/write of data in the nonvolatile memory is not performed normally, so that it is possible that writing of incorrect data or destruction of stored data may occur. For example, generally the storage device of the ink cartridge and the printer are connected by contact between the terminals and various signals such as the reset signal and the like are supplied from the printer to the storage device through the terminals. At this time, when the reset terminal becomes a floating state (non-contact state) or a noise was generated in the reset signal, sometimes the stored data of the nonvolatile memory is destroyed. For example, in the case where the nonvolatile memory is FERAM or the like in which the write operation is needed when read is performed, rewrite is not performed normally when the ID, manufacturing information or the like are read, and thus there is concern that this data is missing.

SUMMARY

An advantage of some aspects of the invention is that it provides a storage device, a substrate, a liquid container, a system and a control method of the nonvolatile storage device for suppressing the destruction of data that is stored in the nonvolatile storage section.

According to an aspect of the invention, there is provided a storage device including: a nonvolatile storage section, and a control section that controls the nonvolatile storage section; wherein the control section includes, an access control section that outputs a clock for access control for performing access control of a read/write of the nonvolatile storage section, and performs access control of the read/write to the nonvolatile storage section, and a masking process section that performs masking process of a reset signal on the basis of the clock for access control of the access control section, and supplies the reset signal after the masking process to the access control section.

According to the aspect of the invention, the clock of the access control that performs the access control of read/write of the nonvolatile storage section is output. Thus, the masking process of the reset signal is performed on the basis of the clock for access control, and the reset signal after the masking process is supplied to the access control section that performs access control of read/write to the nonvolatile storage section. Accordingly, it is possible to suppress the destruction of data that is stored in the nonvolatile memory.

It is preferable that the reset signal from a host device is supplied to the reset terminal that is connected to the host side reset terminal, wherein the masking process section performs the masking process of the reset signal from the reset terminal.

According to the aspect of the invention, the masking process of the reset signal from the reset terminal can be performed. Accordingly, hazards of the reset signal, for example due to a loose contact of the terminals and the like, is masked, and it is possible to suppress the destruction of data that is stored in the nonvolatile memory.

It is preferable that the masking process section outputs an output clock for access control corresponding to the clock for access control to the nonvolatile storage section on the basis of the clock for access control, and performs a masking process in which the reset signal after the masking process is made to be a non-active without depending on the voltage level of the reset signal, in masking period from a first timing that is before an edge timing of the output clock to a second timing that is after the edge timing.

According to the aspect of the invention, the period from the first timing that is before the edge timing of the output clock to the second timing that is after the edge timing may be set to the masking period. Accordingly, the reset signal after the masking process can be made to be the non-active without depending on the voltage level of the reset signal in masking period.

It is preferable that the masking process section makes the edge timing of the clock for access control to the first timing so as to perform the masking process, and outputs the output clock in which the clock for access control is delayed only by a time shorter than the masking period.

According to the aspect of the invention, the edge timing of the clock for access control can be set to the first timing. Accordingly, the edge timing of the output clock can be set to the timing between the first timing and the second timing.

It is preferable that the period from the first timing to the edge timing in masking periods is a period corresponding to a setup time in which at least one of the data and the address in the nonvolatile storage section is latched, and the period from the edge timing to the second timing in masking periods is a period corresponding to a hold time in which at least one of the data and the address in the nonvolatile storage section is latched.

According to the aspect of the invention, the masking periods can be set to the period corresponding to the setup time and the hold time in which at least one of the data and the address in the nonvolatile storage section is latched.

It is preferable that the masking process section has a delay circuit that has a plurality of delay units and outputs a delay clock on the basis of the clock for access control from the access control section, and an output circuit that outputs the reset signal after the masking process on the basis of the clock for access control and the delay clock from the plurality of delay units, and wherein the delay circuit outputs the output clock from a middle tap of the plurality of delay units.

According to the aspect of the invention, the masking process of the reset signal can be performed on the basis of the clock for access control. Also, the reset signal after the masking process is output on the basis of the clock for access control and the delay clock, so that the masking period can be set. The output clock is output from the middle tap of the plurality of delay units, so that the edge timing of the output clock can be set.

It is preferable that the delay circuit sets a tap position of the middle tap on the basis of the setup time and the hold time in which at least one of the data and the address in the nonvolatile storage section is latched.

According to the aspect of the invention, the edge timing of the output clock corresponding to the setup time and the hold time can be set in which at least one of the data and the address in the nonvolatile storage section is latched.

It is preferable that access control section performs the masking process in which the reset signal after the masking process is made to be a non-active without depending on the voltage level of the reset signal in masking period.

According to the aspect of the invention, the reset signal after the masking process can be made to be a non-active without depending on the voltage level of the reset signal in masking period.

It is preferable that the nonvolatile storage section is a ferroelectric memory, wherein masking period is set to be a period of length that secures the read operation and the rewrite operation in access control of the read in the ferroelectric memory.

According to the aspect of the invention, the masking process of the reset signal is performed so that the read operation and the rewrite operation can be secured in access control of the read in the ferroelectric memory.

It is preferable that the control section has a detection circuit that detects an abnormal power supply state of the power supply voltage which is supplied by the host device, wherein the access control section stops access control of the read/write to the nonvolatile storage section in the case where the abnormal power supply state is detected by the detection circuit, and completes access control of the read/write in an access cycle without stopping in the case where the abnormal power supply state is detected by the detection circuit after the start of the access cycle, and wherein the masking process section performs the masking process of the reset signal on the basis of the clock to perform access control of the read/write.

According to the aspect of the invention, in the case where the abnormal power supply state is detected after the start of the access cycle, the access control can be completed without stopping in an access cycle. Accordingly, the masking process of the reset signal can be performed, so that access control can be reliably completed in the access cycle.

According to another aspect of the invention, there is provided a substrate including the storage device according to any aspect of the invention described above.

According to another aspect of the invention, there is provided a liquid container including the storage device according to any aspect of the invention described above.

According to another aspect of the invention, there is provided a system including the storage device and a host device.

According to another aspect of the invention, there is provide a method of controlling a storage device including: controlling a nonvolatile storage section; outputting a clock for access control to perform access control of a read/write of the nonvolatile storage section; performing access control of the read/write to the nonvolatile storage section; and performing the masking process of a reset signal on the basis of the clock for access control, and outputting the reset signal after the masking process.

BRIEF DESCRIPTION OF THE DRAWINGS

The invention will be described with reference to the accompanying drawings, wherein like numbers reference like elements.

FIG. 11A is a view showing an example of a configuration of a ferroelectric memory.

FIG. 11B is a view showing a write operation to a ferroelectric memory cell.

FIG. 11C is a view showing a read operation to the ferroelectric memory cell.

FIG. 12 is a view showing a detailed signal waveform example of a read operation to the ferroelectric memory.

DESCRIPTION OF EXEMPLARY EMBODIMENTS

Hereinafter preferred embodiments of the invention will be described in detail. Also, the embodiments described in below do not limit the substance of the invention described in the appended claims and all configurations described in the following embodiments are not necessarily indispensable as a means of solving the invention.

1. First Exemplary Configuration

Figure 1:
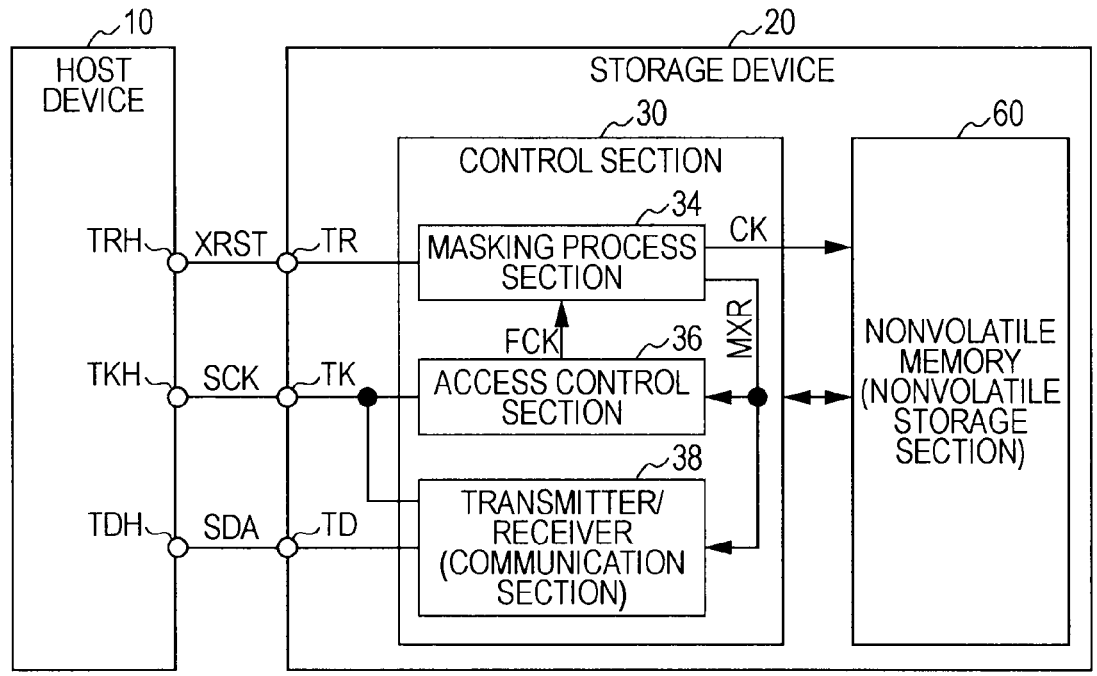
FIG. 1 is a view showing an example of a first configuration of a storage device of the embodiment.

FIG. 1 is a view showing an example of a first configuration of a storage device of the embodiment. The storage device 20 as shown in FIG. 1 includes a control section 30 (a memory control section, control circuit), a nonvolatile memory 60 (in a broader sense, a nonvolatile storage section), a clock terminal TK (a first terminal), a data terminal TD (a second terminal), a reset terminal TR (a third terminal). In addition, the storage device of the embodiment is not limited to the configuration of FIG. 1, and various modification can be made in which some of the constituents (for example, transmitter/receiver, clock terminal, and data terminal) may be omitted, while other constituents may be added.

The storage device 20 performs a masking process of a reset signal XRST so as to suppress the data destruction by the nonvolatile memory 60 due to hazards (glitch, noise and incorrect pulse) of the reset signal XRST. For example, the case is assumed where the host device 10 is an ink jet printer and the storage device 20 is a storage device that is included in the ink cartridge. In this case, it is assumed that there is loose contact of the reset terminals of the cartridge, a coupling among wirings of the control signals within the printer, or the probability of a hazard occurring in the reset signal XRST due to noise or the like.

Now, the reset signal XRST is a signal for initializing the storage device 20. For example, the reset signal XRST becomes active, so that a logic level of a flip-flop circuit or a register that is included in the storage device 20 is initialized (cleared or reset).

A clock terminal TK, a data terminal TD and a reset terminal TR are electrically connected to a host side clock terminal TKH, a host side data terminal TDH and a host side reset terminal TRH of the host device 10 (the host) respectively. For example, each terminal of the host device 10 and the storage device 20 is composed of a metallic terminal and is electrically connected through a physical connection. In the case where the terminal of the host device 10 and the terminal of the storage device 20 are connected, a system clock SCK from the host side clock terminal TKH is supplied to the clock terminal TK. Also, a data signal from the host side data terminal TDH is supplied to the data terminal TD. The reset signal XRST from the host side reset terminal TRH is supplied to the reset terminal TR.

The control section 30 performs the control of the nonvolatile memory 60 (in a broader sense, a nonvolatile storage section) or performs receiving or transmitting of the data (data communication) from or to the host device 10. Specifically, the control section 30 includes a masking process section 34 (a masking process circuit), an access control section 36 (an access control circuit), and a transmitter/receiver 38 (a communication section or a transmitting/receiving circuit).

The masking process section 34 performs the mask process of the reset signal XRST supplied from the reset terminal TR, and outputs the reset signal MXR after the masking process to each constituent of the control section 30. Specifically, the masking process section 34 performs the masking process of the reset signal XRST on the basis of the clock FCK for access control of the nonvolatile memory 60. For example, as described below in FIG. 5 or the like, the output clock CK for access control of the nonvolatile memory 60 is generated on the basis of the clock FCK. Thus, the reset signal XRST is masked through the period before and after an edge of the output clock CK that performs the read/write operation. Thus, the hazard in the reset signal XRST causing the read/write operation of the nonvolatile memory 60 to be incomplete is suppressed.

The access control section 36 performs access control (memory access control) of the read/write to the nonvolatile memory 60. Specifically, the read operation of the data that is stored in each address of the nonvolatile memory 60, or the write operation of data to each address of the nonvolatile memory 60 is performed in synchronization with the system clock SCK of the clock terminal TK. More specifically, on the basis of the signal that is received by the transmitter/receiver 38, the access control section 36 generates the write enable signal, the read address signal, the write data signal and the like so as to perform access control. Also, the access control section 36 may perform the sequential access or may also perform the random access to the nonvolatile memory 60.

The transmitter/receiver 38 (the receiver or the transmitter) performs transmitting/receiving of the data between the host device 10 and the storage device 20 on the basis of the system clock SCK of the terminal TK. Thus, the transmitter/receiver 38 outputs the received data to the access control section 36 and the access control section 36 writes the data on the nonvolatile memory 60. In addition, the transmitter/receiver 38 transmits the data that is read by the access control section 36 from the nonvolatile memory 60 to the host device 10. More specifically, the transmitter/receiver 38 performs transmitting/receiving of the data signal SDA in synchronization with the system clock SCK. For example, the data signal SDA received from the host device 10 includes a command such as a read command or a write command, an address signal and a data signal.

Also, the access control section 36 and the transmitter/receiver 38 may operate in synchronization with the system clock SCK of the clock terminal TK as described above, and in synchronization with the system clock that is masking processed by the clock masking process section as described below in FIG. 6 and the like.

The nonvolatile memory 60 is constituted by a FERAM (ferroelectric memory) or EEPROM (for example, flash memory). The nonvolatile memory 60 may include a memory cell array, a column selection circuit and a row selection circuit. The nonvolatile memory 60 stores the ID and the manufacturing information that was written in manufacturing or information that was written by the host device 10. For example, in the case where the storage device 20 is included in the ink cartridge, the nonvolatile memory 60 stores the manufacturing date as the manufacturing information, the information of ink colors or the like, and stores the information about the remaining amount of ink as a information that was written by the host device 10.

In addition, in the above description, an example was described of the case where a nonvolatile storage section is the nonvolatile memory 60. However, in the embodiment, the nonvolatile storage section may also be another storage section, for example a magnetic drive such as hard disk drive and the like or an optical drive such as DVD and the like. Also, in the above description, an example is described in the case where various signals such as the reset signal and the like are supplied by the contact between the terminals. However, various signals may also be supplied by a non-contact point transfer (non-contact transfer and wireless communication).

2. Access Control

As described above, in the embodiment, the reset signal XRST is masked, so that the hazard in the reset signal XRST causing the read/write operation of the nonvolatile memory 60 to be incomplete is suppressed. Concerning this, detailed description will be made with reference to FIG. 2 to FIG. 5. First of all, description will be made regarding access control of the embodiment with reference to FIG. 2 and FIG. 3.

Figure 2:
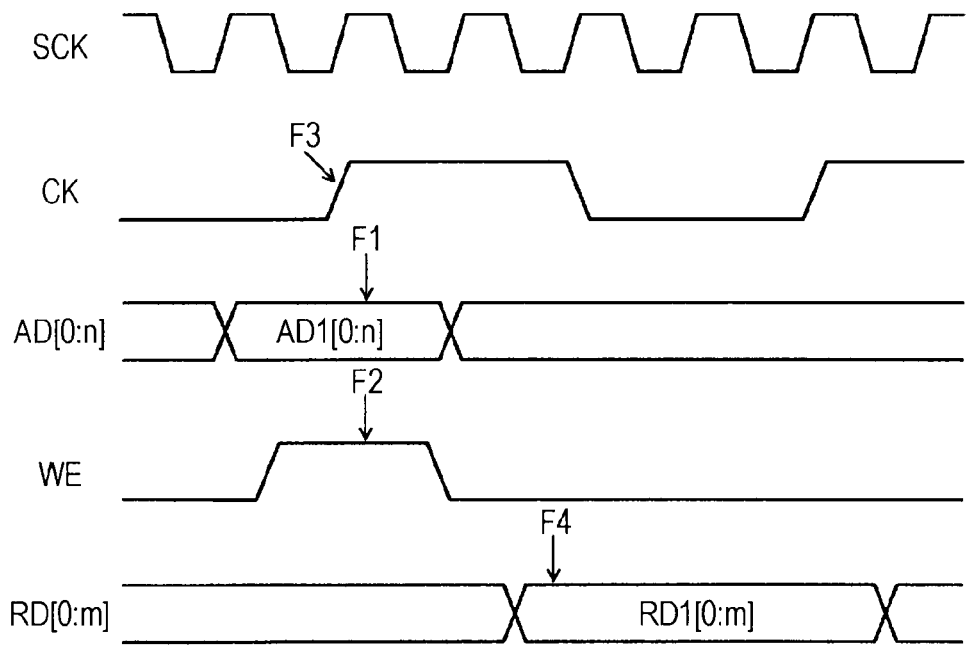
FIG. 2 is a view showing a signal waveform example of a read control to a nonvolatile memory.

FIG. 2 is a view showing a signal waveform example of a read control to a nonvolatile memory. As shown in F1 in FIG. 2, the address signal AD[0:n] becomes the address AD1[0:n], and as shown in F2, the write enable signal WE becomes high level. Thus, as shown in F3, when an active edge (a rising edge or a falling edge) of the output clock CK for memory access is input, as shown in F4, the data RD1[0:m] of the address AD1[0:n] is read as the read data RD[0:m] (n and m are natural numbers).

Figure 3:
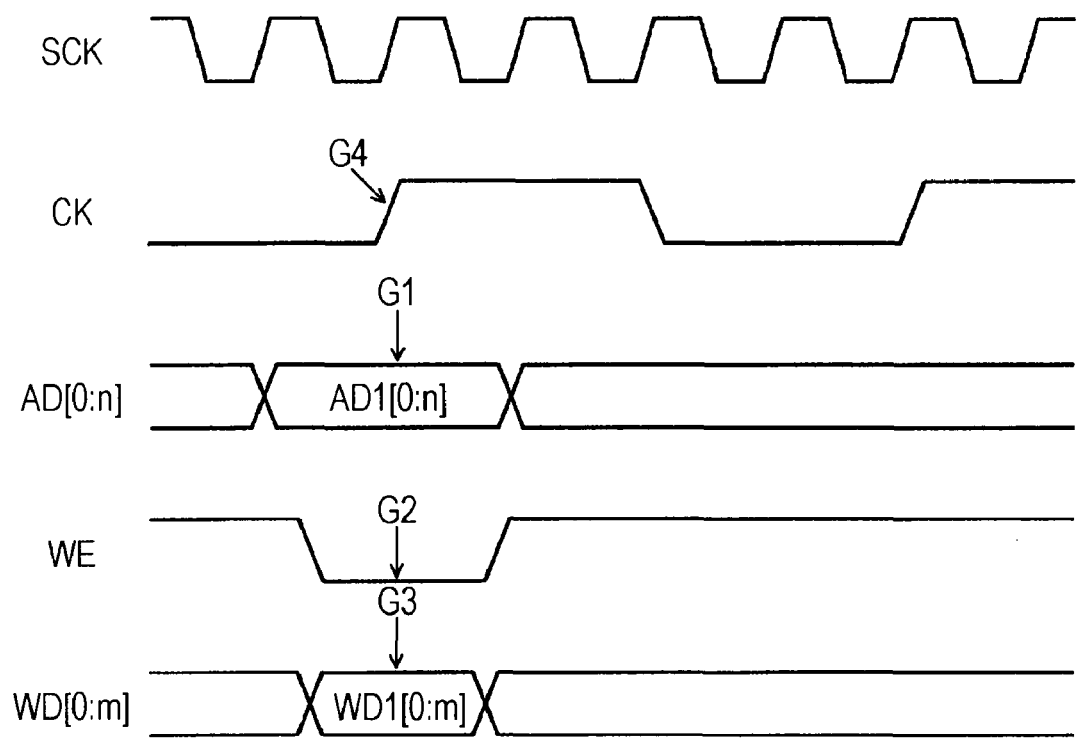
FIG. 3 is a view showing a signal waveform example of a write control to the nonvolatile memory.

FIG. 3 is a view showing a signal waveform example of a write control to the nonvolatile memory. As shown in G1 in FIG. 3, the address signal AD[0:n] becomes the address AD1 [0:n], and as shown in G2, the write enable signal WE becomes low level (active). As shown in G3, the write data WD1[0:m] is supplied as the data signal WD[0:m]. Also, as shown in G4, when the rising edge of the clock CK is input, the write data WD1[0:m] is written on the address AD1[0:n].

As described above, in the embodiment, the read operation or the write operation is started by the active edge of the output clock CK. For example, the address signal AD1[0:n], write data WD1[0:m] or the like is latched on the latch circuit by the active edge of the output clock CK, although the latch circuit is not shown in the drawings and is included in the nonvolatile memory 60 by the active edge of the output clock CK so that the read operation or the write operation is started. In addition, as described below with reference to FIG. 12 and the like, the nonvolatile memory 60 generates the control signal in accordance with the active edge of the output clock CK so that the read operation or the write operation is started.

At this time, when a hazard is occurred in the reset signal XRST, the read operation or the write operation may not be performed normally. Specifically, the address signal AD1[0: n] or the like that is output by the access control section 36 is reset by the hazard in the reset signal XRST. When the reset is generated in the setup time or the hold time of the latch timing of the nonvolatile memory 60, the address signal AD1[0:n] and the like may not be latched normally. Also, the clock FCK for access control that is output by the access control section 36 is reset, and the output clock CK is reset as well by the hazard in the reset signal XRST. Thus, in the case where an active period (a high level period) of the clock CK which is necessary for the nonvolatile memory 60 generating the control signal may not be secured, the read operation or the write operation also may not be secured.

3. Masking Process Section

Figure 4:
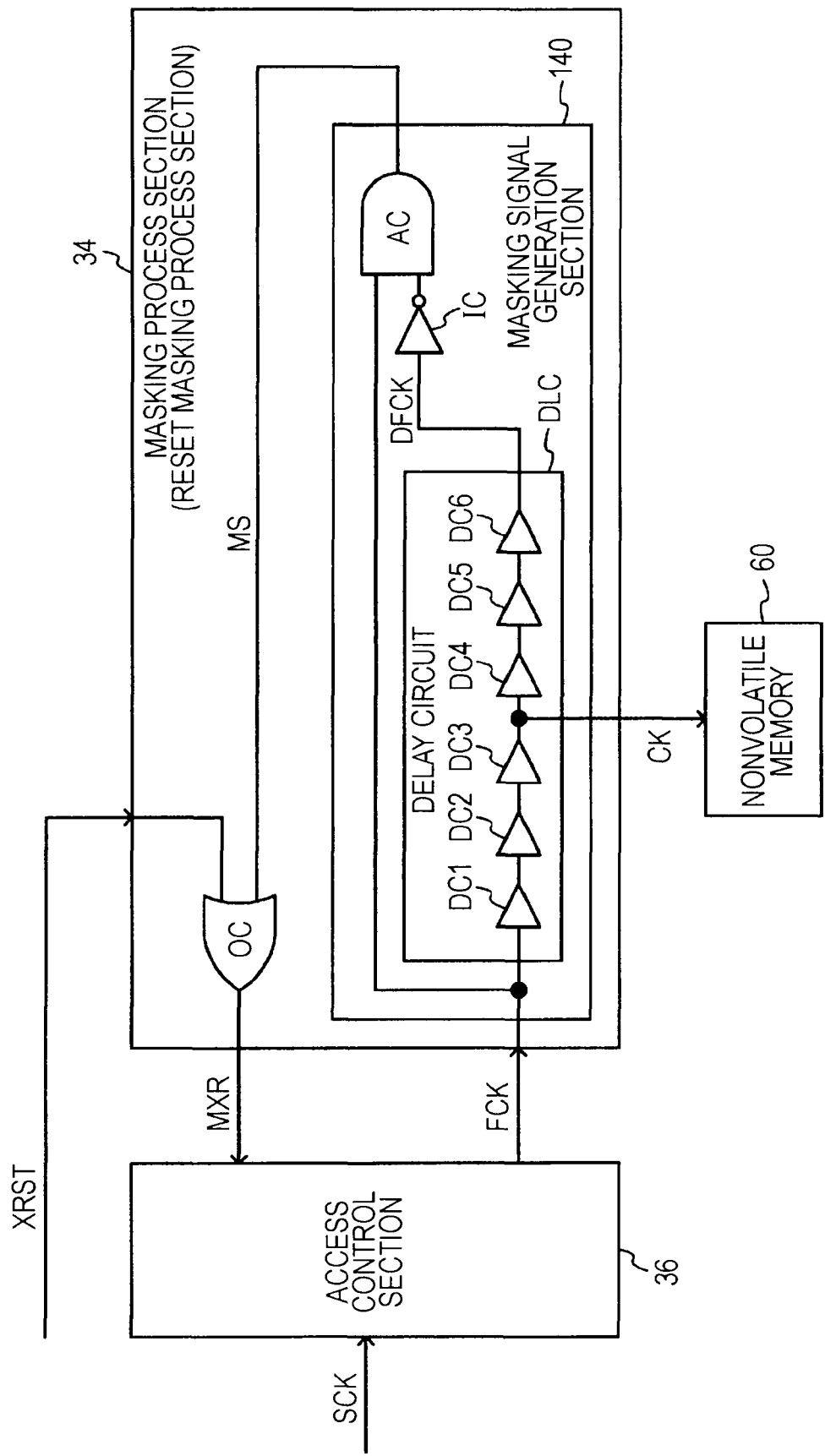
FIG. 4 is a view showing a detailed example of a configuration of a masking process section.

Meanwhile, in the embodiment, the masking process of the reset signal XRST is performed, so that the hazard in the reset signal XRST is masked throughout the period before and after the active edge of the clock CK. FIG. 4 is a view showing a detailed configuration example of a masking process section (a reset masking process section). The masking process section 34 includes a masking signal generation section 140 and an OR circuit OC (a logic OR circuit, and in a broader sense, the masking process circuit). And, the masking process section of the embodiment is not limited to the configuration, further various modified examples may be made in which some of the constituents may be omitted, or other constituents may be added.

The masking signal generation section 140 receives the clock FCK from the access control section 36 so as to output the masking signal MS for masking the reset signal XRST and to output the output clock CK for access control of the nonvolatile memory 60. The OR circuit OC receives the masking signal MS and the reset signal XRST so as to output the reset signal MXR after the masking process.

Specifically, the masking signal generation section 140 includes a delay circuit DLC, an inverter circuit IC and an AND circuit AC (a logic AND circuit). The delay circuit DLC includes first to sixth delay buffers DC1 to DC6 (a plurality of delay units, a plurality of delay elements and a plurality of delay circuits). Also, for the sake of a brief description, the example is described of the case where the delay circuit DLC includes 6 delay buffers DC1 to DC6 in FIG. 4. However, in the embodiment, the number of the delay buffer is not limited to 6 but the delay circuit DLC may also include first to $j_{th}$ delay buffers DC1 to DCj (j is a natural number).

The delay buffers DC1 to DC6 successively delays the clock FCK and outputs the output clock CK and the delay clock DFCK. In other words, the delay buffers DC1 to DC6 outputs a plurality of delay clocks on which the clock edge is successively delayed, according to each delay buffer being successively passed. Thus, any one of the plurality of delay clocks is output as the output clock CK. For example, as shown in FIG. 4, DC3 outputs the output clock CK. Also, the DC6 outputs the delay clock DFCK. The edge timing of the output clock CK is set depending which one of the delay clocks that are output by the delay buffers DC1 to DC6 in the output clock CK (tap position). The inverter IC inverts and outputs the logic level of the delay clock DFCK.

The AND circuit AC computes the logic AND of the output signal of the inverter IC and clock FCK and outputs the computation result as the masking signal MS. Specifically, the differential pulse of the rising edge (or the falling edge) of the clock FCK is output as the masking signal MS. The length of the masking period in which the masking signal MS becomes high level (active, the first logic level) is set by the delay time according to the delay buffers DC1 to DC6.

The OR circuit OC performs the masking process of the reset signal XRST on the basis of the masking signal MS. Specifically, in masking period, after the masking process, the logic level of the reset signal XRST is fixed so as to mask the reset signal XRST. In other words, in the case where the masking signal MS is high level, the signal XRST of high level is output independently of the voltage level of the reset signal XRST. In the case where the masking signal MS is low level (non-active, the second logic level), a logic level that is the same logic level of the reset signal XRST is output as a signal MXR.

Figure 5:
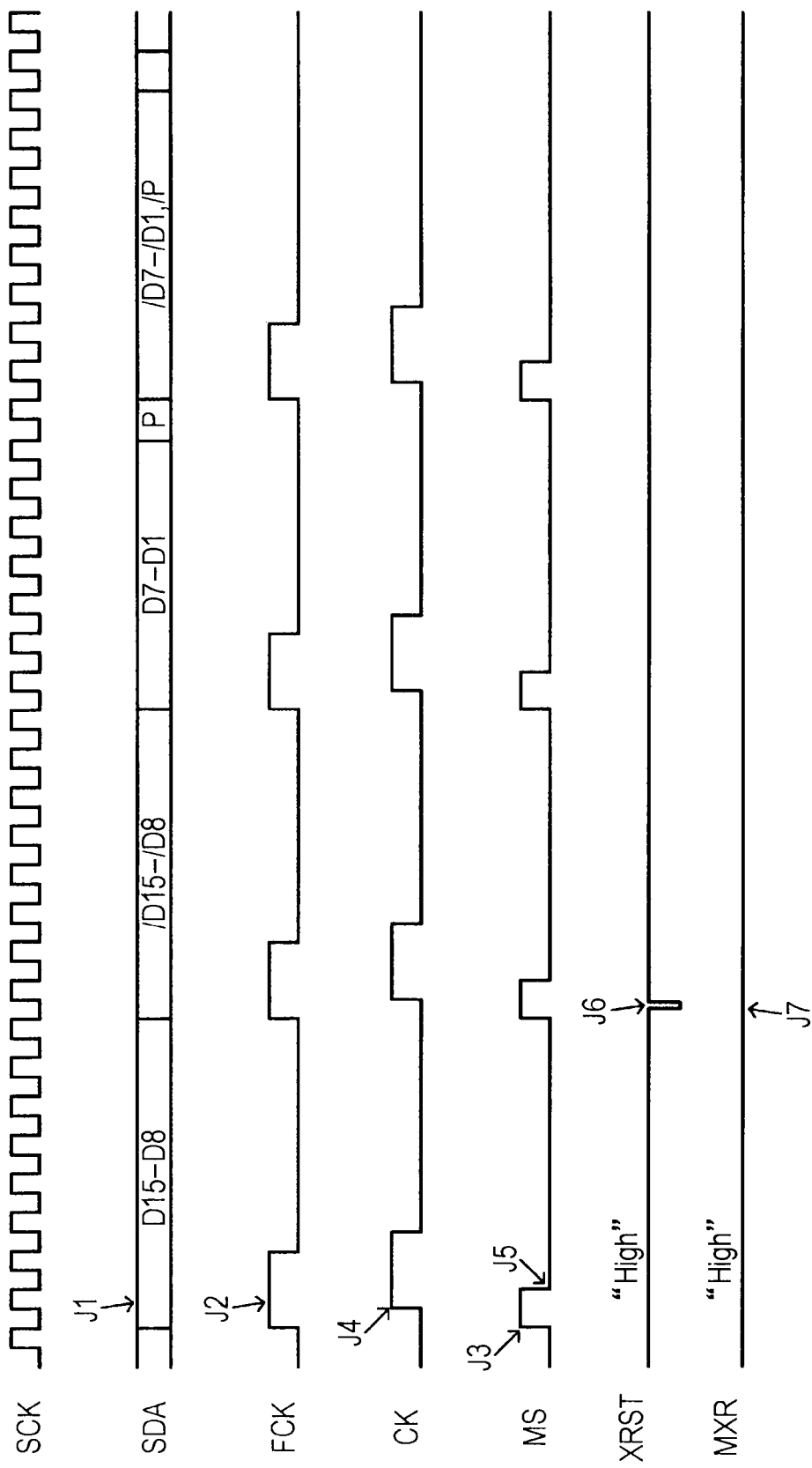
FIG. 5 is a view showing a signal waveform example of the masking process section.

FIG. 5 is a view schematically showing a signal waveform example of the masking process section. As shown in J1 referring to FIG. 5, serial data (for example, the original data D15 to D1, the original parity bit P or the like) is input from the host device 10. As shown in J2, the clock FCK for access control in which the number of 1 write bit (for example, 8 bits) is 1 period is generated. Also, as shown in J3, the masking signal MS becomes high level in the timing (the first timing) of the rising edge of the clock FCK. As shown in J4, the active edge of the output clock CK is output in masking period. As shown in J5, after that (the second timing), the masking signal MS becomes low level. Thus, as shown in J6, even when a hazard occurs in the reset signal XRST in masking period, as shown in J7, after the masking process, the reset signal MXR outputs high level.

However, in the case where the hazard occurs in a signal such as the reset signal or the like, the data read/write of the nonvolatile memory is not performed normally, so that there is a problem that the writing of incorrect data or the destruction of the storage data may occur.

At this point, according to the embodiment, the access control section 36 outputs the clock FCK for access control to perform access control of the read/write of the nonvolatile memory 60, and performs access control of the read/write to the nonvolatile memory 60. Thus, the masking process section 34 performs the masking process of the reset signal XRST on the basis of the clock FCK for access control, and after the masking process, the reset signal MXR is supplied to the access control section 36.

Thus, it is possible to suppress the destruction of the storage data of the nonvolatile memory. Specifically, on the basis of the clock FCK for access control to perform access control of the read/write of the nonvolatile memory 60, the masking process of the reset signal XRST is performed, so that access control of the read/write of the nonvolatile memory 60 can be performed normally.

More specifically, in the embodiment, the masking process section 34 outputs the output clock CK for access control corresponding to the clock FCK. Thus, independently of the voltage level of the reset signal XRST, after the masking process, the reset signal MXR is inactive in masking period from the first timing that begins the active edge (edge timing) of the output clock CK to the second timing that ends the edge timing.

Thus, the reset signal XRST is masked throughout the period before and after the active edge of the output clock CK so that the reset signal XRST is masked in throughout the period before and after the timing that starts access control of the nonvolatile memory 60. Thus, access control of the read/write of the nonvolatile memory 60 can be performed normally.

For example, in the embodiment, the masking period from the first timing to the edge timing of the clock CK is a period corresponding to the setup time that latches at least one of the write data and the address in the nonvolatile memory 60. Also, the period from the edge timing of the clock CK to the second timing is a period corresponding to the hold time that latches at least one of the write data and the address in the nonvolatile memory 60.

Thus, the masking period is set as described above, so that the reset signal XRST is masked in the period corresponding to the setup time or the hold time when the nonvolatile memory 60 latches at least one of the write data and the address. Thus, the nonvolatile memory 60 can latch the write data or the address normally.

Also, in the embodiment, the masking period is set to the period of a length that secures the read operation or the write operation of the nonvolatile memory 60. For example, as described below, the nonvolatile memory 60 may also be a ferroelectric memory. Thus, the masking period may also be set to the period of length that secures the read operation or the rewrite operation in access control of the read of the ferroelectric memory.

Thus, the read operation or the write operation of the nonvolatile memory 60 can reliably start. Specifically, the nonvolatile memory 60 may generate the control signal that is for performing the read operation or the write operation on the basis of the active edge of the clock CK. Thus, in the case that the nonvolatile memory 60 is the ferroelectric memory, it can finish the rewrite operation reliably so that the destruction of data may be suppressed.

Now, the period of the length that secures the read operation and the rewrite operation is the period that secures the beginning and the end of the read operation and the rewrite operation. The period is not effectively the period until the read operation and the rewrite operation are finished. For example, as described below with reference to FIG. 13 and the like, the period is a period of the length necessary for generating various control signal of the ferroelectric memory on the basis of the active edge of the clock CK.

As described above with reference to FIG. 1 and the like, in the embodiment, the reset signal XRST from the host device 10 is supplied to the reset terminal TR that is connected to the host side reset terminal TRH. Thus, the masking process section 34 performs the masking process of the reset signal XRST from the reset terminal TR.

Thus, in the embodiment, the masking process of the reset signal XRST that is supplied from the reset terminal TR is performed, so that the hazard in the reset signal XRST that is caused by the loose contact of the terminal or the like can be masked.

As described above with reference to FIG. 5 and the like, in the embodiment, the masking process section 34 performs the masking process at the edge timing of the clock FCK serving as the first timing. Thus, the output clock CK in which the clock FCK is delayed only by a time shorter than the masking period is output.

Thus, the first timing of the masking period beginning may be set to the timing that is before the active edge of the output clock CK, and the second timing of the masking period finish may be set to the timing that is after the edge timing.

Also, in the embodiment, the delay circuit DLC outputs the delay clock DFCK on the basis of clock FCK, and the masking signal generation circuit 140 outputs the masking signal MS on the basis of the delay clock DFCK and the clock FCK. Thus, a plurality of delay circuits DC1 to DC6 that is included in the delay circuit DLC outputs the output clock CK from the middle tap.

Thus, the edge timing of the clock FCK may be set to the first timing. Also, the active edge of the output clock CK may be output between the first timing and the second timing.

Also, in the embodiment, the tap position of the middle tap of the plurality of delay circuits DC1 to DC6 may be set on the basis of the hold time and the setup time that latches at least one of the write data and the address in the nonvolatile memory 60.

Thus, the masking period from the first timing to the active edge of the clock CK can be set to the period of the length corresponding to the setup time. Also, the masking period from the active edge of the clock CK to the second timing can be set to the period of the length corresponding to the hold time.

As described below with reference to FIG. 6 and the like, in the embodiment, the control section 30 may has a detection circuit 32 that detects the abnormal power supply state of the power supply voltage VDD that is supplied from the host device 10, and the access control section 36 may stop the access control in the case that abnormal power supply state is detected. Thus, in the case that access control section 36 detects the abnormal power supply state after the start of the access cycle, it can complete without stopping the access control in the access cycle.

Thus, in the case that abnormal power supply state is detected the access control can stop. Thus, the access control is performed in the abnormal power supply state so that the data destruction can be suppressed. Also, in the case that abnormal power supply state is detected after the start of the access cycle, it can complete without stopping the access control in the access cycle. Thus, It is possible to suppress the data destruction caused by immediate stop of the access control during the read operation or the write operation. Thus, the masking process of the reset signal XRST is performed, so that access control is reliably completed in the access cycle.

4. Second Exemplary Configuration

As described above, in the embodiment, the masking process of the reset signal XRST is performed so that the data destruction of the nonvolatile memory 60 is suppressed. However, in the case that abnormal power supply of the storage device 20 occurs, the read operation or the write operation is incomplete by the power supply abnormality, and it is possible that the data destruction may also occur.

Figure 6:
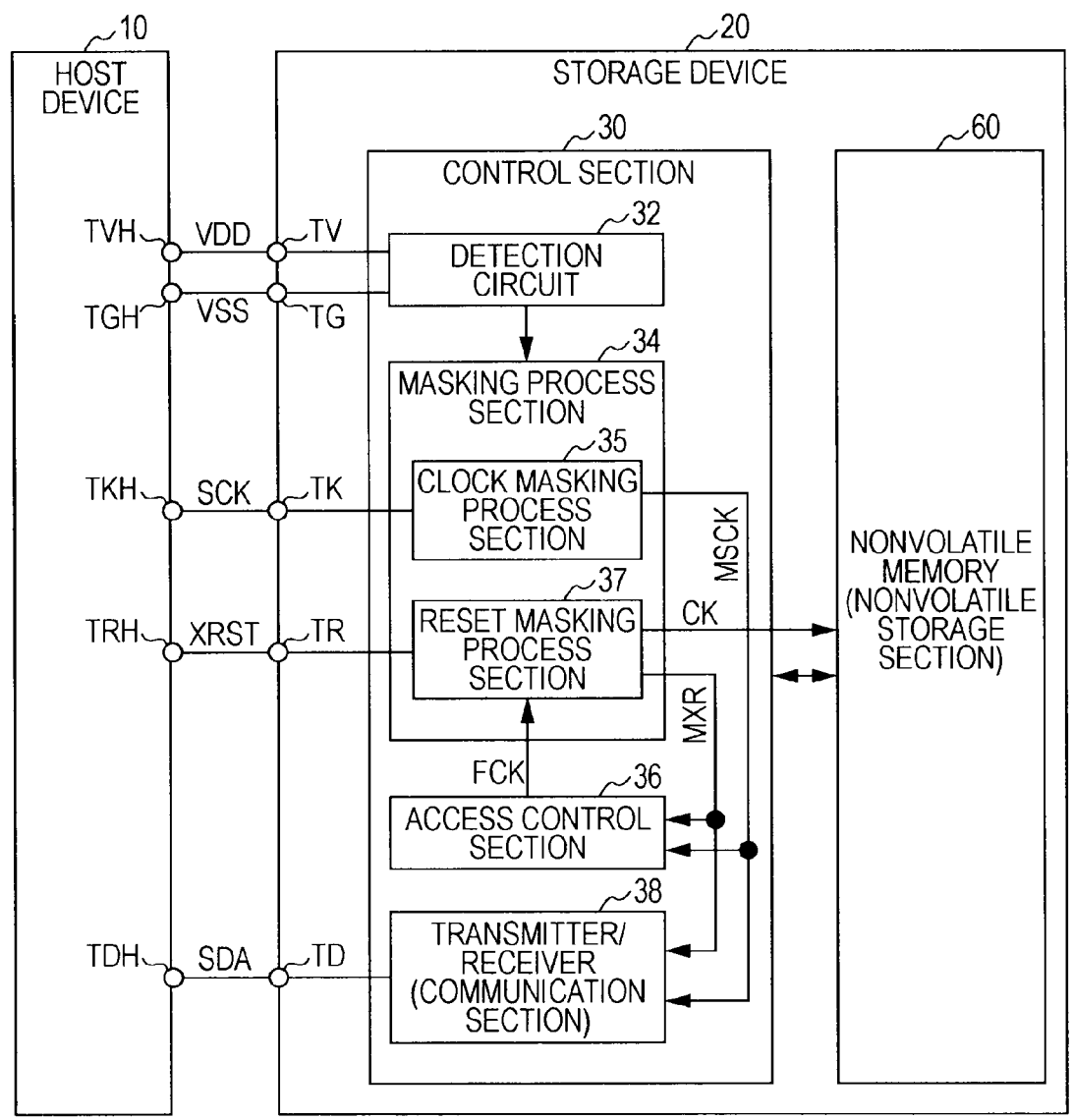
FIG. 6 is a view showing an example of a second configuration of the storage device of the embodiment.

FIG. 6 is a view showing a second configuration example of the storage device of the embodiment that can solve the problem. The storage device 20 includes the control section 30, the nonvolatile memory 60, the power supply terminal TV (the first power supply terminal, the high voltage side power supply terminal), the ground terminal TG (the second power supply terminal, the low voltage side power supply terminal), the clock terminal TK, the data terminal TD, and the reset terminal TR. And, hereafter, the constituents of the nonvolatile memory 60 and the like which are described in FIG. 1 and the like are expressed by the like numerals and are omitted appropriately.

Further to the masking process of the reset signal XRST, in the case that abnormal power supply state is detected, the storage device 20 performs the masking process of the system clock SCK. Thus, the masking process of the system clock SCK is performed, so that access control to the nonvolatile memory 60 is stopped.

Specifically, the power supply terminal TV and the ground terminal TG are electrically connected to the host side power supply terminal TVH and the host side ground terminal TGH of the host device 10 respectively. In the case that the terminal of the host device 10 and the terminal of the storage device 20 are connected, the power supply voltage VDD (the first power supply voltage, the high voltage side power supply voltage) from the host side power supply terminal TVH is supplied to the power supply terminal TV. Also, the ground voltage VSS (the second power supply voltage, the low voltage side power supply voltage) from the host side ground terminal TGH is supplied to the ground terminal TG.

The control section 30 detects the abnormal power supply state or performs the masking process of the system clock SCK. Specifically, the control section 30 includes the detection circuit 32 (the detection section), the masking process section 34, the access control section 36 and the transmitter/receiver 38.

The detection circuit 32 detects the abnormality of the power supply that is supplied to the storage device 20 and outputs the detection signal (the information of the detection result) to the masking process section 34. Specifically, the detection circuit 32 detects the floating state (open state, non-contact state) of the power supply terminal TV, the floating state of the ground terminal TG or the voltage drop of the power supply voltage VDD. For example, the floating state of the power supply terminal TV or the ground terminal TG is occurred by the insert of the foreign materials, the loose contact of the terminal or the like. The detection circuit 32 detects the floating states on the basis of the voltage from the power supply terminal TV or the ground terminal TG.

The masking process section 34 includes the reset masking process section 37 and the clock masking process section 35. The reset masking process section 37 performs the masking process of the above-described reset signal XRST. The clock masking process section 35 performs the masking process of the system clock SCK on the basis of the detection signal from the detection circuit 32. Also, the system clock SCK may be supplied from the terminal TK as shown in FIG. 6, or may also be generated within the storage device 20.

In the case that the detection circuit 32 detects the power supply abnormality, the clock masking process section 35 masking the system clock SCK from the clock terminal TK. In other words, regarding the constituents of the control section 30 such as the access control section 36, the transmitter/receiver 38 and the like, the system clock SCK is not supplied.

For example, after the masking process, the system clock is fixed in the low level (the first logic level) or in the high level (the second logic level), so that the SCK is not supplied. In this case, the operation of the storage device 20 is stopped. In other words, the read operation/the write operation to the nonvolatile memory 60 or the data transmitting/receiving to/from the host device 10 is not performed. Meanwhile, in the case that the detection circuit 32 does not detect the power supply abnormality, the clock masking process section 35 does not masking the system clock SCK but supplies the SCK to the constituents of the control section 30. In this case, the storage device 20 performs normal operation.

Also, the storage device of the embodiment is not limited to the configuration of the FIG. 6, and various modifications can be made in which some of the constituents (for example, the clock terminal, the data terminal and transmitter/receiver) may be omitted, while other constituents may also be added.

5. Detection Circuit and Clock Masking Process Section

Figure 7:
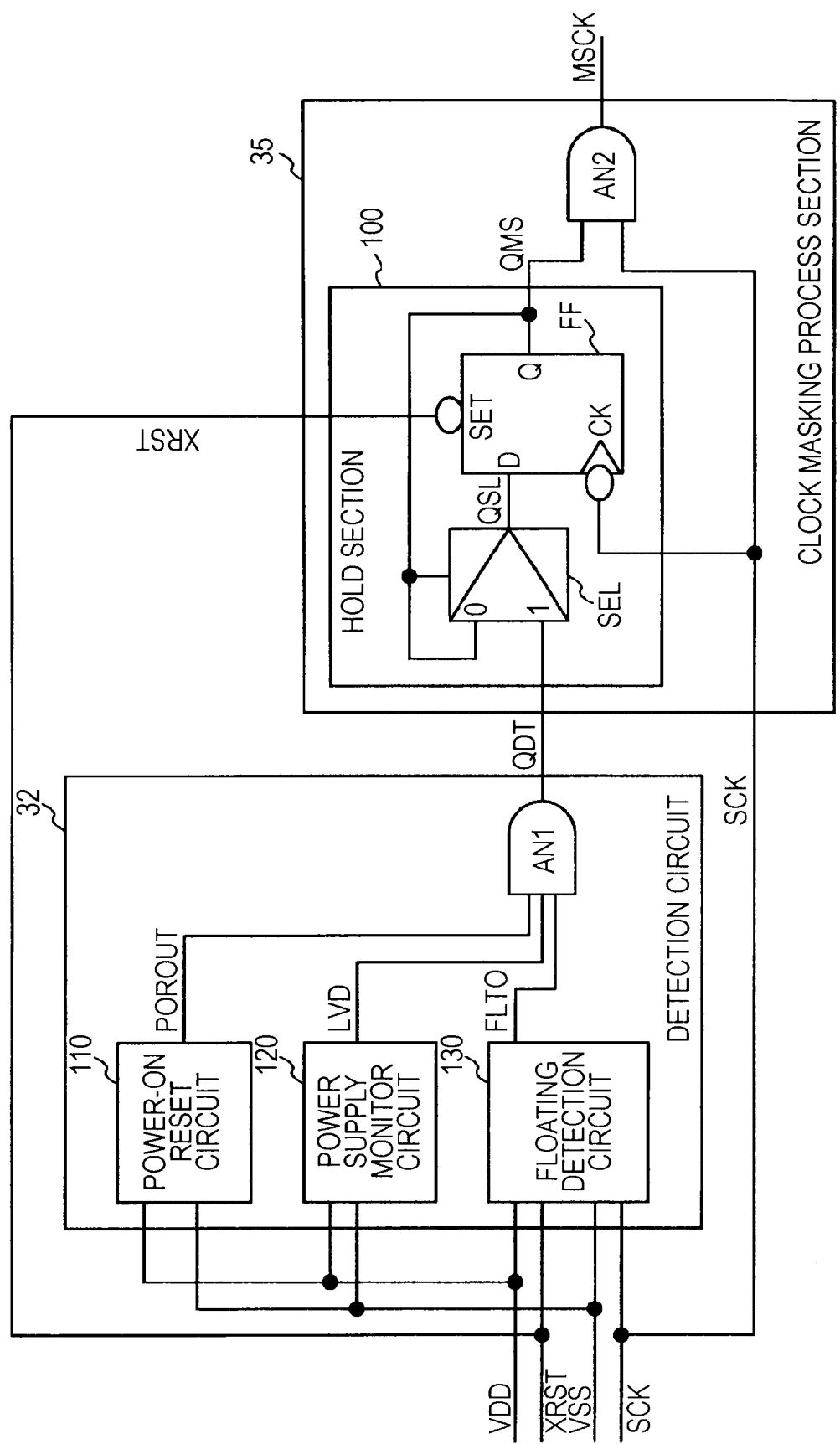
FIG. 7 is a view showing a detailed example of a configuration of a detection circuit and a detailed example of a configuration of a clock masking process circuit.

FIG. 7 is a view showing a detailed configuration example of a detection circuit 32 that detects the abnormal power supply state and a detailed configuration example of a clock masking process section 35 (in a broader sense, a masking process section) that performs the masking process of system clock SCK. The detection circuit 32 as shown in FIG. 7 includes a power-on reset circuit 110, a power supply monitor circuit 120 (a power supply voltage drop detection circuit), a floating detection circuit 130 and an AND circuit AN1 (a logic AND circuit). Also, the clock masking process section 35 as shown in FIG. 7 includes a hold circuit 100 (a hold section) and an AND circuit AN2 (a logic AND circuit). Also, the detection circuit and the masking process circuit of the embodiment are not limited to the configuration, various modified examples can be made so that some of the configuration (for example, the power-on reset circuit and power supply monitor circuit) may be omitted, and other constituents may also add.

The power-on reset circuit 110 performs the power-on reset on the basis of the power supply voltage VDD. Specifically, the storage device 20 is in the reset state until the power supply is input and the reset of the storage device 20 is released when the power supply is input. When the power supply of the host device 10 is input and the difference between the power supply voltage VDD and the ground voltage VSS becomes the threshold voltage (a predetermined voltage) or more, the power-on reset circuit 110 makes the output signal POROUT to be high level (in a broader sense, the first logic level).

The power supply monitor circuit 120 detects the voltage drop of the power supply voltage VDD. Specifically, the power supply monitor circuit 120 outputs the output signal LVD of the high level in the case that the difference between the power supply voltage VDD and the ground voltage VSS is the threshold voltage or more. Meanwhile, the power supply monitor circuit 120 outputs the output signal LVD of the low level (in a broader sense, the second logic level) in the case that the difference between the power supply voltage VDD and the ground voltage VSS is the threshold voltage or less.

The floating detection circuit 130 detects the floating state of the power supply terminal TV and the ground terminal TG. For example, the floating detection circuit 130 compares the power supply voltage VDD or the ground voltage VSS and the voltage of the reference signal, and thus detects the floating state. For example, as the reference signal, the reset signal XRST or system clock SCK is used. In this case, for example, the voltage difference between the high level (VDD) that is supplied as the reset signal XRST and the voltage of the power supply terminal TV is detected so as to detect the floating state of the power supply terminal TV. Thus, in the case that the floating state is not detected, the detection circuit 32 outputs the output signal FLTO of the high level and in the case that the floating state is detected, the detection circuit 32 outputs the output signal FLTO of the low level.

The AND circuit AN1 computes the logic AND of the output signal POROUT from the power-on reset circuit 110, the output signal LVD from the power supply monitor circuit 120 and the output signal FLTO from the floating detection circuit 130. In other words, in the case that at least one of POROUT, LVD and FLTO is low level (active), the output signal QDT of the low level (active) is output.

The hold section 100 (in a broader sense, the masking signal generation circuit) outputs the masking signal QMS for the masking process of the system clock SCK on the basis of the detection signal QDT from the detection circuit 32. Specifically, the masking signal QMS is non-active until the floating state is detected and is active in the case that the floating state is detected. Thus, once after the masking signal QMS is active, the QMS is maintained in active. More specifically, the hold section 100 maintains the detection signal QDT. In other words, when the detection signal QDT is changed to the low level, even after that, the low level is also maintained. The hold section 100 includes the selector SEL (the selection circuit) and the flip-flop circuit FF.

The selector SEL selects either the detection signal QDT or the masking signal QMS on the basis of the masking signal QMS and outputs the selected signal as the output signal QSL. Specifically, in the case that the masking signal QMS is high level, the detection signal QDT is selected and output and in the case that the masking signal QMS is low level, the masking signal QMS is selected and output.

The flip-flop circuit FF latches (holds) the logic level of the output signal QSL from the selector SEL at the falling edge (or the rising edge) of the system clock SCK and outputs the masking signal QMS of the latched logic level. Also, when the reset signal XRST (or set signal) is active, the latched logic level is reset (or set). Specifically, in the case that the reset signal XRST is low level, the masking signal QMS is reset (cleared) and outputs the masking signal QMS of the high level. Meanwhile, in the case that the reset signal XRST is low level, the reset is released and outputs the masking signal QMS of the latched logic level.

Because the masking signal QMS is output just after the reset is released, the selector SEL selects the detection signal QDT. When the detection signal QDT becomes low level, then the output signal QSL of the selector SEL becomes low level and the flip-flop circuit FF latches the low level. Thus, the masking signal QMS of the low level is selected by the selector SEL, so that the masking signal QMS holds in the low level. The hold state is maintained until to be reset by the reset signal XRST.

The AND circuit AN2 (in a broader sense, the masking process circuit) performs the masking process of the system clock SCK on the basis of the masking signal QMS. Specifically, the AND circuit AN2 computes the logical AND of the masking signal QMS and the system clock SCK. In other words, in the case that the masking signal QMS is low level, after the masking process, the system clock MSCK is low level and the system clock SCK is not supplied to the circuit of the latter step. Meanwhile, in the case that the masking signal QMS is high level, after the masking process, the system clock MSCK is output as the system clock SCK and the system clock SCK is supplied to the circuit of the latter step.

6. Abnormal Power Supply Detection and Masking Process

Figure 8:
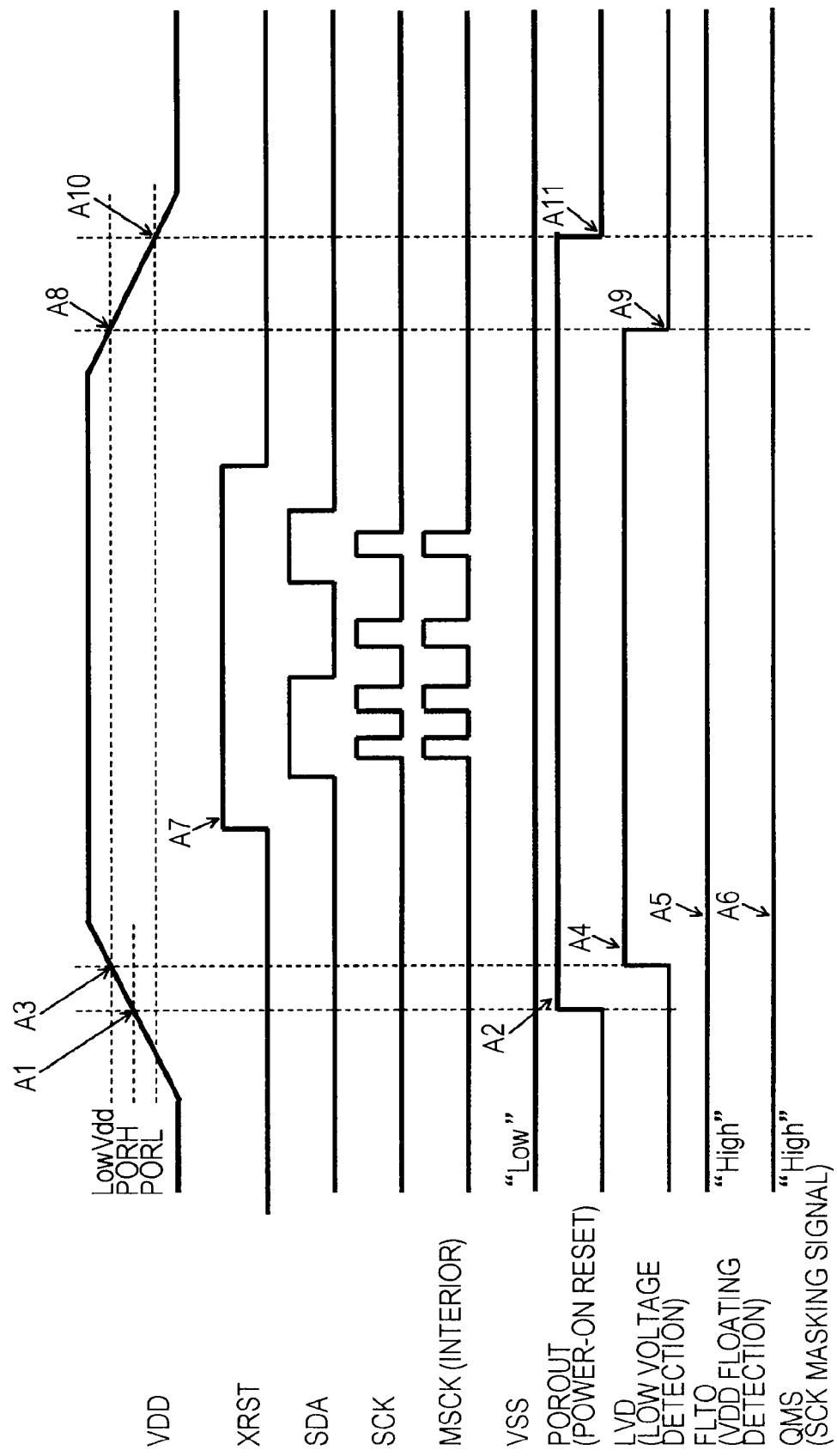
FIG. 8 is a view showing an operation example of a abnormal power supply detection and a masking process.

A description will be made regarding an operation example of the power supply abnormal detection and an operation example of the masking process of the system clock SCK with reference to FIG. 8 and FIG. 9. FIG. 8 shows the operation example of the normal operation, in other words in the case that abnormal power supply such as the floating and the like of the power supply terminal is not present.

As shown in A1 in FIG. 8, when the power supply voltage VDD exceeds the threshold voltage PORH (the first threshold voltage), as shown in A2, the signal POROUT becomes high level and the power-on reset is released. As shown in A3, when the VDD exceeds the threshold voltage LowVDD, as shown in A4, the signal LVD becomes high level and the low voltage detection becomes the non-detection state. As shown in A5, the high level is output to the signal FLTO and the floating detection becomes non-detection state. Thus, as shown in A6, the high level is output to the masking signal QMS and the system clock SCK is supplied to the control section.

Thus, as shown in A7, the reset signal XRST becomes high level so as to release the reset and the data signal SDA and system clock SCK is input. As shown in A8, when the power supply becomes OFF and the VDD becomes the threshold voltage LowVDD or less, as shown in A9, the signal LVD becomes low level. As shown in A10, when the VDD becomes the threshold voltage PORL (the second threshold voltage) or less, as shown in A11, the signal POROUT becomes low level.

Figure 9:
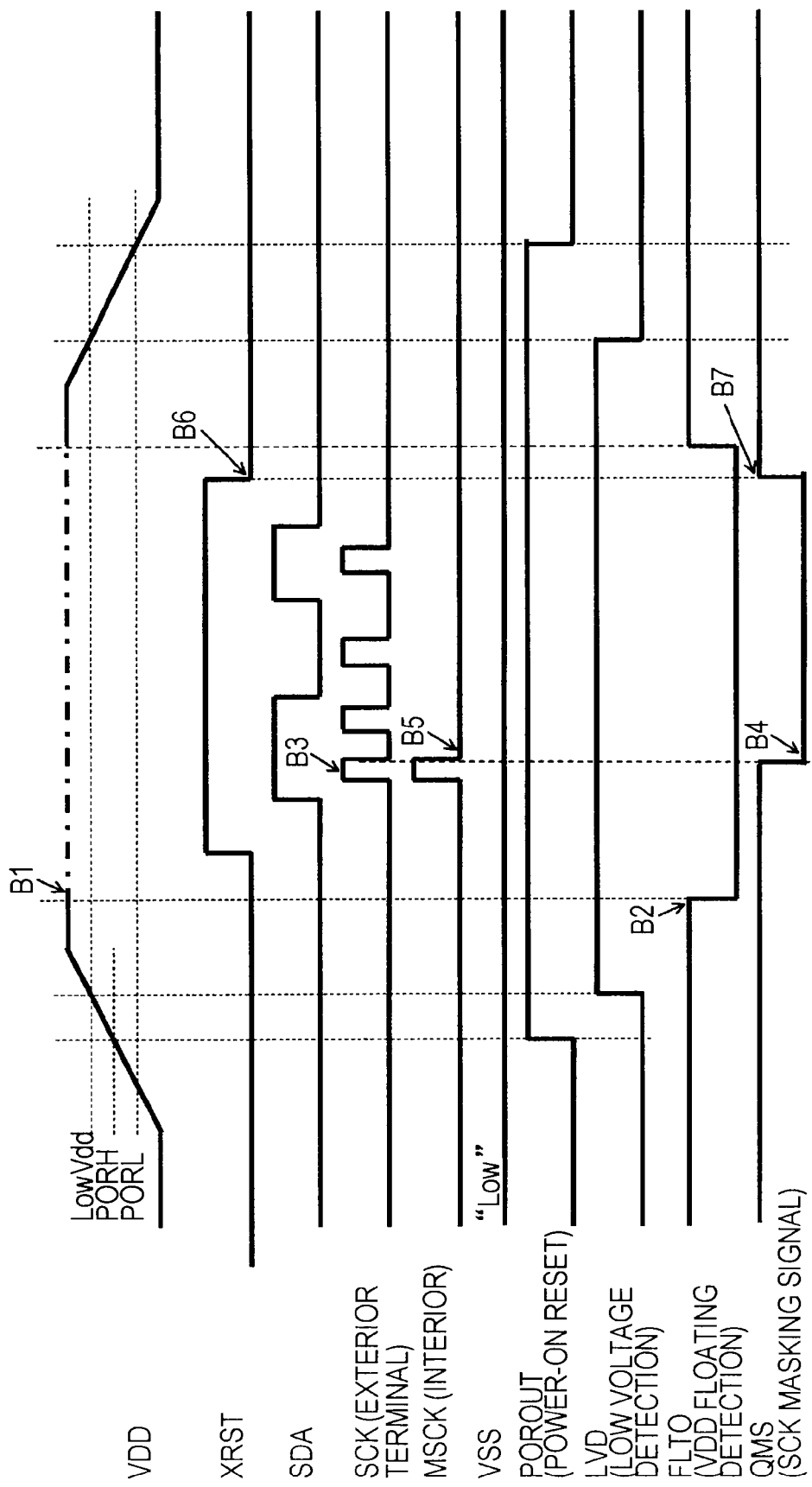
FIG. 9 is a view showing an operation example of the abnormal power supply detection and the masking process.

FIG. 9 shows an operation example in the case that the power supply terminal TV or the ground terminal TG becomes floating state before the system clock SCK is input.

As shown in B1 in FIG. 9, when the power supply terminal TV becomes the floating state, as shown in B2, the signal FLTO becomes low level. As shown in B3, the system clock SCK is input, as shown in B4, the masking signal QMS becomes low level in the initial falling edge of the SCK. Thus, as shown in B5, the SCK is output to the initial falling edge of the SCK in the system clock MSCK after the masking process, then the low level is output after that. As shown in B6, when the reset is released, as shown in B7, the hold state of the masking signal QMS is released and the QMS becomes high level. The other operation is the same as that of the operation example described above in FIG. 8.

As described above, in the normal operation as shown in FIG. 8, the system clock SCK is supplied and the normal access control or the like is performed. Meanwhile, when the floating state as shown in FIG. 9 is detected, the masking signal QMS maintains in low level (active). Thus, the system clock SCK is masked and the access control or the like stops.

And, in FIG. 9, the example is described in the case that the floating state is detected before the system clock SCK has been input, however the operation is the same as even in the case that the drop of the power supply voltage is detected. Also, in the case that after the input of the system clock SCK starts, the power supply abnormality is detected, and after the detection, the SKC is masked in the initial falling edge of the SCK. Also, once after the power supply abnormality is detected, even in the case that abnormal power supply state is removed, the masking signal QMS holds in active level by the hold circuit 100 until the reset is released.

7. Abnormal Power Supply Detection in the Access Cycle

As described above, in the embodiment, in the case that the power supply abnormality is detected, the access control or the like to the nonvolatile memory 60 stops. However, when the write operation or the read operation stopped on the way, it is rather concerned that the data is destructed. Thus, in the embodiment, in the case that the power supply abnormality is detected in the access cycle, the write operation or the read operation is completed (is continued) without halt in the access cycle.

First of all, the description will be made regarding the access control using FIG. 10 in the case that abnormal power supply state is detected in the access cycle. And, an example description will be specifically made using FIG. 11A to FIG. 13, regarding the completion of the write operation or the read operation in the case that the nonvolatile memory 60 is the ferroelectric memory.

Figure 10:
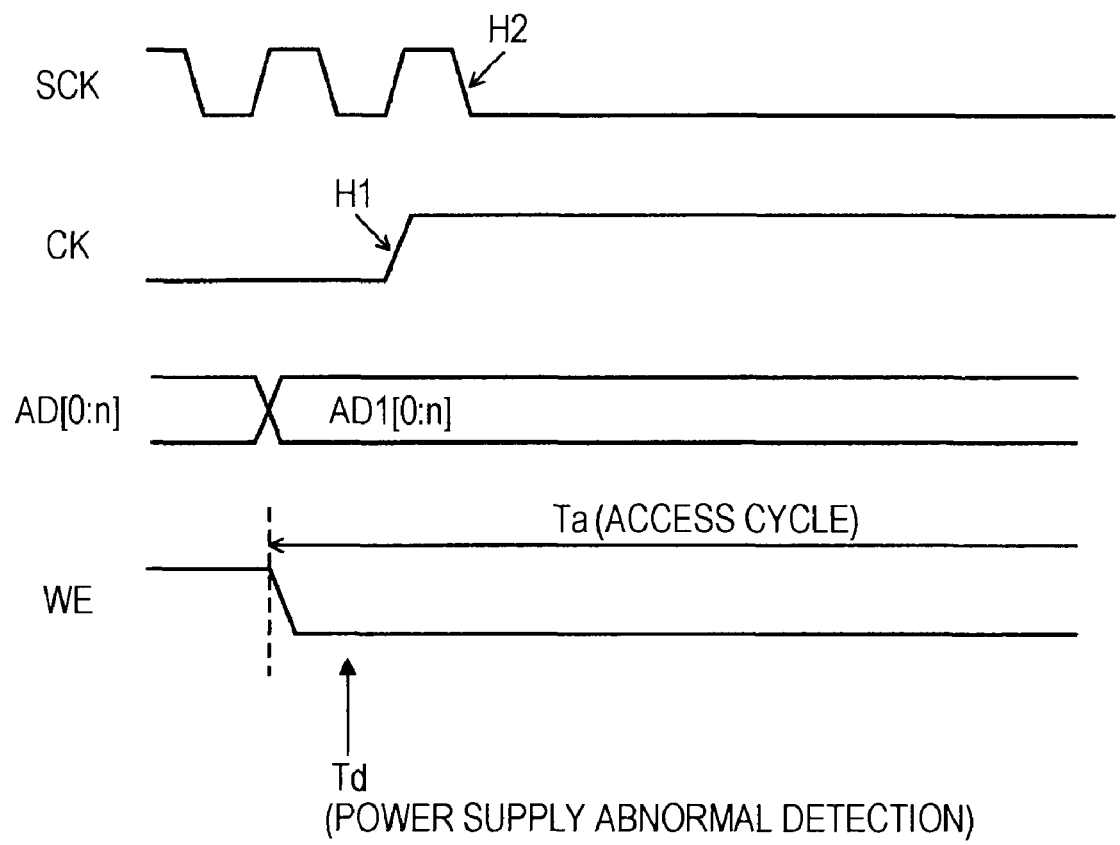
FIG. 10 is a view showing a signal waveform example of an access control to a nonvolatile memory in the case that abnormal power supply was detected.

As shown in FIG. 10, the abnormal power supply state is detected on the timing Td in the access cycle Ta (the access period). Then, as shown in H1, the edge of the clock CK that is for performing the write operation or the read operation is output (the CK becomes active), as shown in H2, the system clock SCK is masked. When the system clock SCK is masked, the clock CK or the address signal AD[0:n] and the write enable signal WE is not changed. In the embodiment, in the case that the edge of the clock CK that is for performing the write operation or the read operation is output, even when the system clock SCK is masked, the write operation or the read operation completes without halt in the access cycle Ta.

Now, the access cycle Ta is the period that is started from the timing in which the write enable signal WE or the address signal AD[0:n] is supplied to the nonvolatile memory 60 for example. Meanwhile, in the case that the SCK is masked in the falling edge (or the rising edge) of the system clock SCK, it is the period that is started from the falling edge of the system clock SCK just before the edge of the clock CK that is for performing the write operation or the read operation is output. Thus, the access cycle Ta is the period that is finished by the completion of the write operation or the read operation to the address AD1[0:n] of the access object in the Ta for example. Meanwhile, it is the period that is finished by the start of the next access cycle.

Also, in the embodiment, even in the case that abnormal power supply state is detected in the access cycle Ta, in the case that the system clock SCK is masked before the edge of the clock CK that is for performing the write operation or the read operation is output, the access control may be stopped as well. In other words, the write operation or the read operation is not performed in the access cycle Ta, the operation may also be stopped.

8. Ferroelectric Memory

Next, an example description will be specifically made regarding the completion of the write operation or the read operation, in the case that the nonvolatile memory 60 is the ferroelectric memory 60 using FIG. 11A to FIG. 13. However, in the embodiment, the nonvolatile memory 60 may also be other nonvolatile memory such as EEPROM or the like.

FIG. 11A is a view showing a configuration example of a ferroelectric memory. The ferroelectric memory includes a ferroelectric capacitor CS, an N type transfer transistor TR (in a broader sense, the first conductive type transistor), a sense amplifier SA, a first and a second transistor SW1 and SW2, and a latch LT. Also, in the FIG. 11A, the example is described in the case that the memory cell is 1T1C (1 Transistor 1 Capacitor) type, however in the embodiment, it may also be 2T2C (2 Transistor 2 Capacitor) type, FET type or the like.

A nod NC is connected to one end of the ferroelectric capacitor CS, and a plate line PL is connected to the other end thereof. The gate electrode of the transistor TR is connected to the word line WL, the source electrode (the drain electrode) is connected to a bit line BL1 and the drain electrode (the source electrode) is connected to a nod NC. Thus, the ferroelectric capacitor CS and the transistor TR constitute the memory cell, and a plurality of memory cell is positioned along the bit line BL1 and the word line WL.

The sense amplifier SA amplifies the electric charge (voltage) that is read to the bit line BL1 and outputs the voltage that is amplified to the bit line BL2. For example, as the amplified voltage, the power supply voltage VCC corresponding to the logic "1" or 0V corresponding to the logic "0" is output. For example, the N type transistor constitute the transistors SW1 and SW2 and ON.OFF is controlled by the signal YSEL. The signal YSEL becomes active when the signal is read from the memory cell. The latch LT holds (latches) the read logic level (the voltage level) and outputs the held logic level as the output signal LTQ.

The description will be made regarding write operation of the ferroelectric memory cell using FIG. 11B. As shown in FIG. 11B, in the case that the logic "1" is written in the memory cell, the selection voltage is applied to the word line WL, the voltage of the power supply voltage VCC (for example, the power supply voltage VDD, in a broader sense, the first power supply voltage) is applied to the bit line BL1, and the 0V (for example, the ground voltage VSS, in a broader sense, the second power supply voltage) is applied to the plate line PL. Thus, the residual polarization of the ferroelectric capacitor CS becomes "negative". As described above, for example the state that the residual polarization is "negative" may be defined as the state that the logic "1" is stored.

Meanwhile, in the case that the logic "0" is written in the memory cell, the selection voltage is applied to the word line WL, the 0V is applied to the bit line BL1, and the VCC (for example, 5V) is applied to the plate line PL. Thus, the residual polarization of the ferroelectric capacitor CS becomes "positive". As described above, for example the state that the residual polarization is "positive" may be defined as the state that the logic "0" is stored.

The description will be made regarding the read operation to the ferroelectric memory cell using FIG. 11C. As shown in FIG. 11C, in the first period T1, the selection voltage is applied to the word line WL and the transfer of the electric charge is performed from the ferroelectric capacitor CS to the bit line BL1. Subsequently, in the second period T2, the sense amplifier SA amplifies the voltage of the bit line BL1. Thus, in the third period T3, the data (the logic "0" or "1") that was read is maintained, and the rewrite operation performs so as to recovery the data that has been destroyed by the read.

Also, in the embodiment, the read operation may be performed in order described above, or may also be performed in other order, for example the sense amplifier amplification and rewrite operation may be performed in the same period and the holding operation may be performed in the next period.

FIG. 12 is a view showing a detailed signal waveform example of a read operation to the ferroelectric memory. As shown in I1 in FIG. 12, when the rising edge of the clock CK is input, as shown in I2, the power supply voltage VCC is applied to the word line WL. Thus, as shown in I3, the power supply voltage VCC is applied to the plate line PL, and as shown in I4, the electric charge of the ferroelectric capacitor CS is read to the bit line BL1. As shown in I5, the sense amplifier SA is ON, and as shown in I6, the voltage that is amplified (to be high level, or to be low level) by the sense amplifier SA is output to the bit line BL2. Also, as shown in I7, the YSEL is high level (active) so that the BL1 and the BL2 are the same voltage.

As shown in I8, the read logic level is latched in the rising edge (the active edge) of the output data latch signal LAT. As shown in I9, 0V is applied to the plate line PL, and the voltage of the bit line BL1 (BL2) is rewritten to the ferroelectric capacitor CS. Thus, as shown in I10, the output enable signal OE becomes high level (active) and the latched logic level is output as the read data.

As shown in I11, in the case that abnormal power supply state is detected in the access cycle Ta, the clock CK does not become falling down. Thus, in the embodiment, above-described access control is performed by the rising edge of the clock CK so as to complete the access control.

Figure 13:
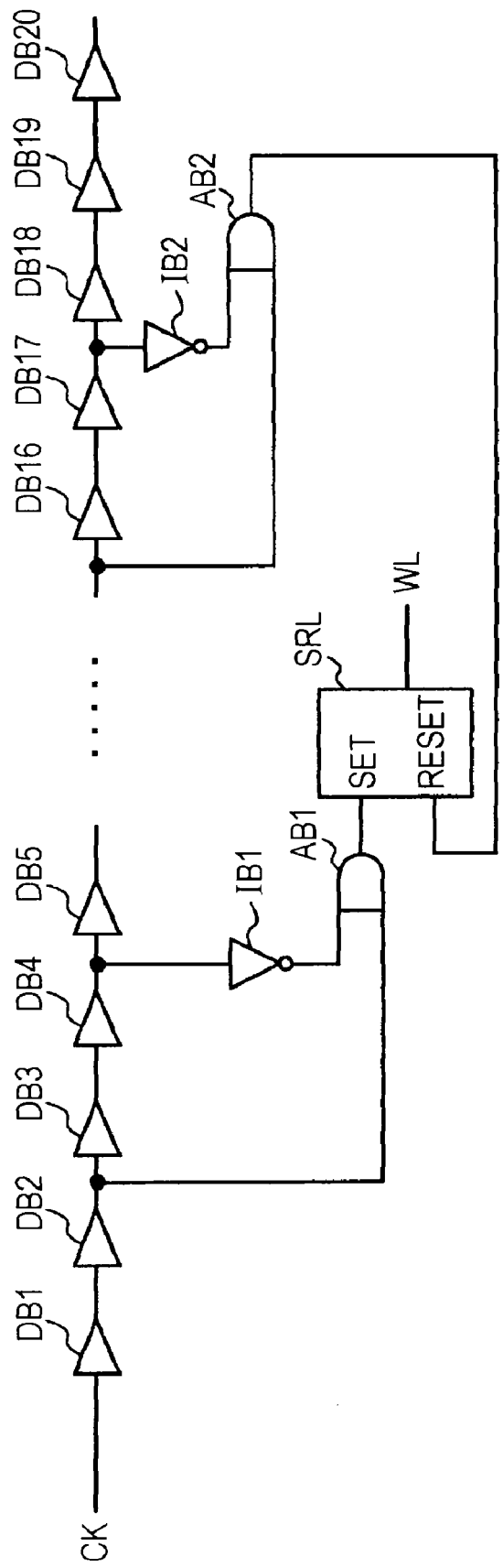
FIG. 13 is a view showing a detailed example of a configuration of a signal generation circuit.

FIG. 13 is a view showing a detailed configuration example of a signal generation circuit in which the control signal is generated by the rising edge of the clock CK. The signal generation circuit includes delay buffers DB1 to DB20 (in a broader sense, DB1 to DBi. i is a natural number), inverters IB1 and IB2, AND circuits AB1 and AB2 (logic AND circuit) and set/reset latch SLR. For example, the signal generation circuit may be included in the access control section 36 or the nonvolatile memory 60 as shown in FIG. 6. And, in FIG. 13, the description regarding the control signal of the word line WL is described. However, the other control signals may also be generated in the same manner.

The delay buffers DB1 to DB20 receives clock CK so that the clock CK is sequentially delayed. The inverter IB1 inverses the output logic level of the DB4. The output signal of the DB2 and the output signal of the inverter IB1 are input in the AND circuit AB1. The inverter IB2 inverses the output logic level of the DB17. The output signal of the DB15 and the output signal of the inverter IB2 are input in the AND circuit AB2. The output signal of the AND circuit AB1 is input in the set terminal of the latch SLR and the output signal of the AND circuit AB2 is input in the reset terminal.

When the rising edge of the clock CK is input, the AB1 outputs the high pulse (the differential pulse of the rising edge of the CK) according to the delay of the DB3 and DB4. The latch SLR receives the high pulse so that the logic level of the word line WL is high level. Thus, after passing the period from the delay of DB5 to DB15, the AND circuit AB2 outputs the high pulse. The latch SLR receives the high pulse so that the word line WL is low level. Thus, the control signal is generated from the rising edge of the clock CK.

Also, for example, the masking period of the above-described reset signal XRST is set to the period of which the length may output the differential pulse of the rising edge of the clock CK. Specifically, in the case of the control signal of the word line WL, the masking period is set to the time longer than the delay time of the DB3 and DB4 (or DB16 and DB17). Thus, the masking period of the reset signal XRST is set so that the start of the read operation or the rewrite operation may be secured.

9. Liquid Container

Next, the description will be made regarding the detailed configuration example of the liquid container that is provided in the storage device of the embodiment using FIG. 14. And, hereinafter, the description will be made as an example in the case that the host device is an ink jet type printer, the liquid container is an ink cartridge and the substrate is a circuit substrate that is provided on the ink cartridge. However, in the embodiment, the host device, the liquid container and the substrate may also be the other device, container and substrate. For example, the host device may be the reader/writer of the memory card and the substrate may also be the circuit substrate that is provided on the memory card.

Figure 14:
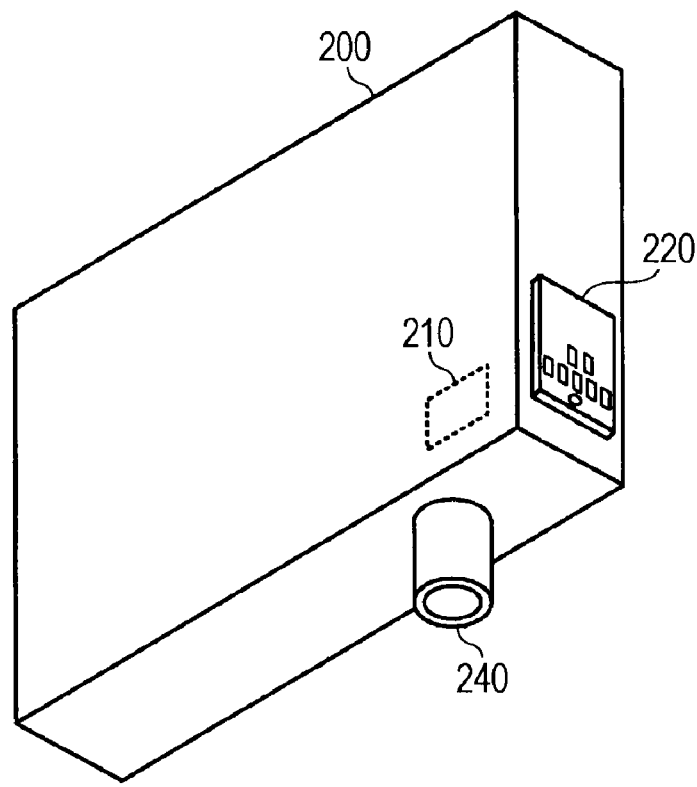
FIG. 14 is a view showing a detailed example of a configuration of the ink cartridge.

In the inside of the ink cartridge 200 (in a broader sense, the liquid container) as shown in FIG. 14, an ink chamber that is not shown in the drawing is formed for containing ink. Also, an ink supply port 240 that is communicating with the ink chamber is provided in the ink cartridge 200. The ink supply port 240 is for supplying ink to the print head unit when the ink cartridge 200 has been provided on the printer.

The ink cartridge 200 includes a sensor 210 and a circuit substrate 220 (in a broader sense, a substrate). The sensor 210 is for detecting the remaining amount of ink within the ink chamber. The sensor 210 is constituted by the piezoelectric element and is fixed within the ink cartridge 200. The storage device 20 of the embodiment is provided in the circuit substrate 220, and performs the storage of the data or the transmitting/receiving of data to/from the host device 10. The circuit substrate 220 is realized, for example by the print substrate, and is provided on the surface of the ink cartridge 200. The terminal of the power supply terminal TV or the like is provided in the circuit substrate 220. Thus, when the ink cartridge 200 is provided in the printer, those terminals and the printer side terminals are contacted (electrically contacted) so at to perform the transmitting/receiving of the power supply or data.

10. Substrate

Figure 15A:
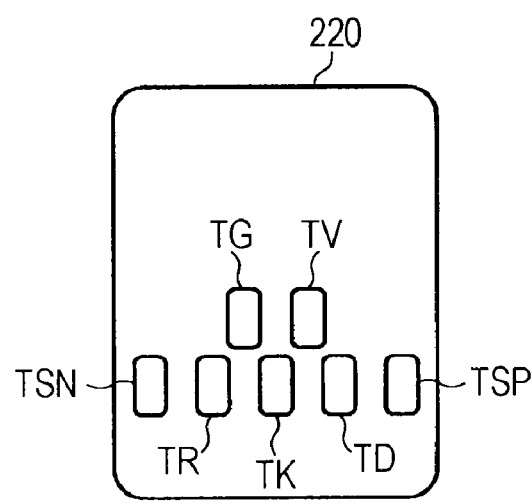
FIG. 15A and FIG. 15B are views showing a detailed example of a configuration of a circuit substrate.
Figure 15B:
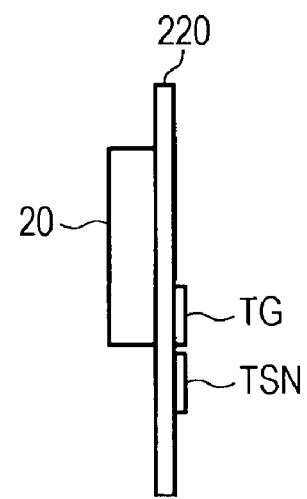

FIG. 15A and FIG. 15B are views showing detailed configuration examples of circuit substrate on which the storage device of the embodiment is provided. As shown in FIG. 15A, terminal group having a plurality of the terminals are provided on the surface (the connecting surface to the printer) of the circuit substrate 220. The terminal group includes the ground terminal TG, the power supply terminal TV, the first terminal TSN for driving the sensor, the reset terminal TR, the clock terminal TK, the data terminal TD and the second terminal TSP for driving the sensor. Each terminal is realized, for example by the metal terminal that is formed with the rectangular shape (substantially rectangular shape). Thus, each terminal is connected to the storage device 20 or the sensor 210 through the wiring pattern or the through hole that is not shown in the drawings and that is provided on the circuit substrate 220.

As shown in FIG. 15B, the storage device 20 of the embodiment is provided in the rear surface (the rear surface of the connecting surface to the printer) of the circuit substrate 220. The semiconductor storage device that has the ferroelectric memory realizes the storage device 20, for example. A number of data related to ink or the ink cartridge 200 is stored, for example the data such as the consumption amount of ink, the color of ink or the like are stored in the storage device 20. Data of the consumption amount of ink regarding ink received in the ink cartridge 200 is a data indicating the total amount of the ink amount consumed in the performing of the print or the like. Data of the consumption amount of ink may be the information indicating the ink amount within the ink cartridge 200 or may also be the information indicating the rate of the consumption amount of ink.

11. System

Figure 16:
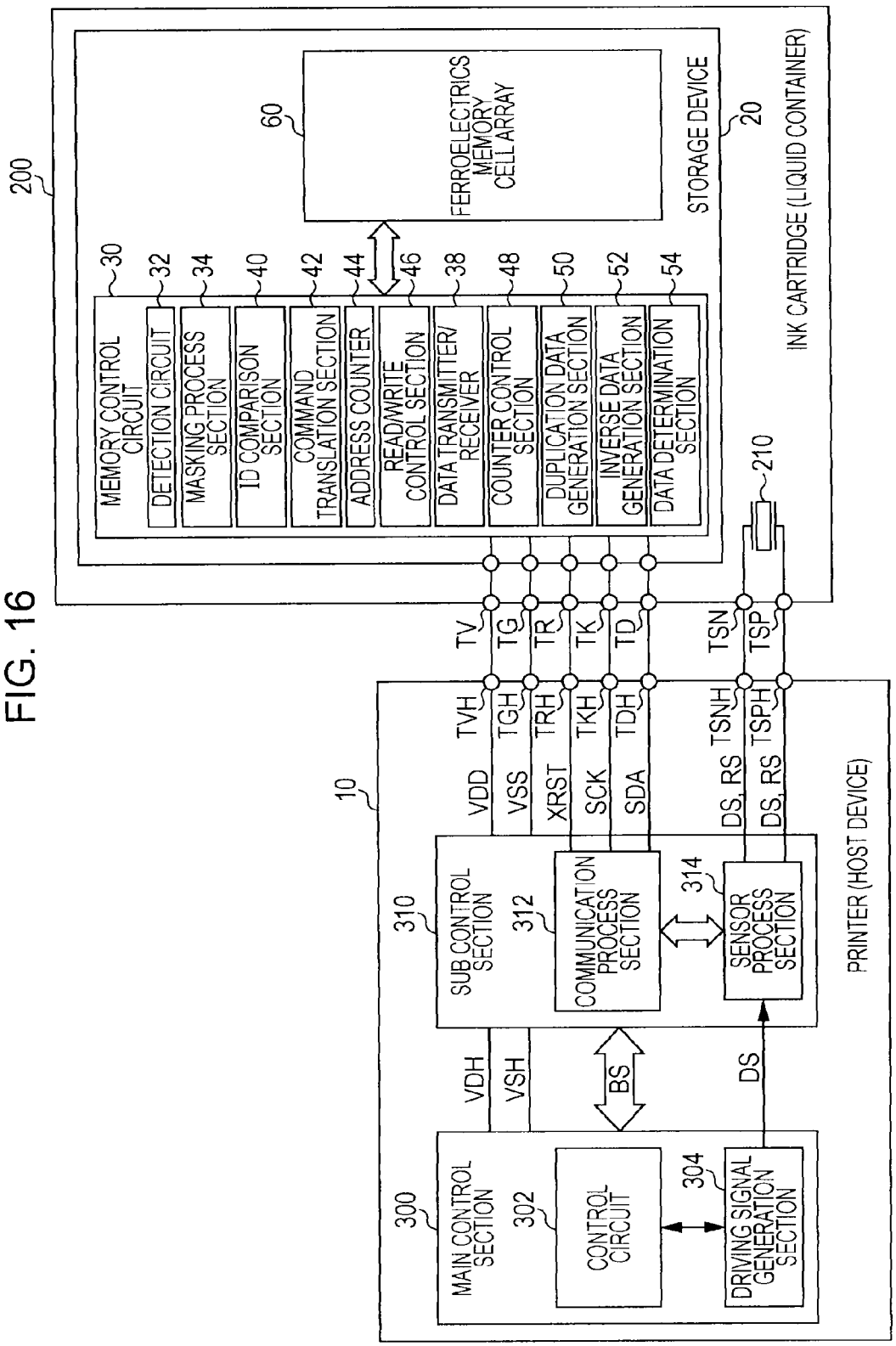
FIG. 16 is a view showing a detailed example of a configuration of a system.

FIG. 16 is a view showing a detailed configuration example of a system in which the storage device of the embodiment is used. The system (the information process system, the print system) as shown in FIG. 16 includes the printer 10 and the ink cartridge 200. The printer 10 includes a main control section 300 and a sub control section 310. The ink cartridge 200 includes the storage device 20 of the embodiment and the sensor 210. Also, hereinafter, the description will be made as an example in the case that one ink cartridge is provided in the printer, however in the embodiment, a plurality of the ink cartridge may also be provided on the printer.

The sub control section 310 supplies the power supply voltage VDD and the ground voltage VSS to the storage device 20 through the power supply terminal TVH and the ground terminal TGH respectively. Also, the sub control section 310 performs the data read/write to the storage device 20 or performs the sensor process using the sensor 210. Specifically, the sub control section 310 includes the communication process section 312 and the sensor process section 314.

Figure 17:
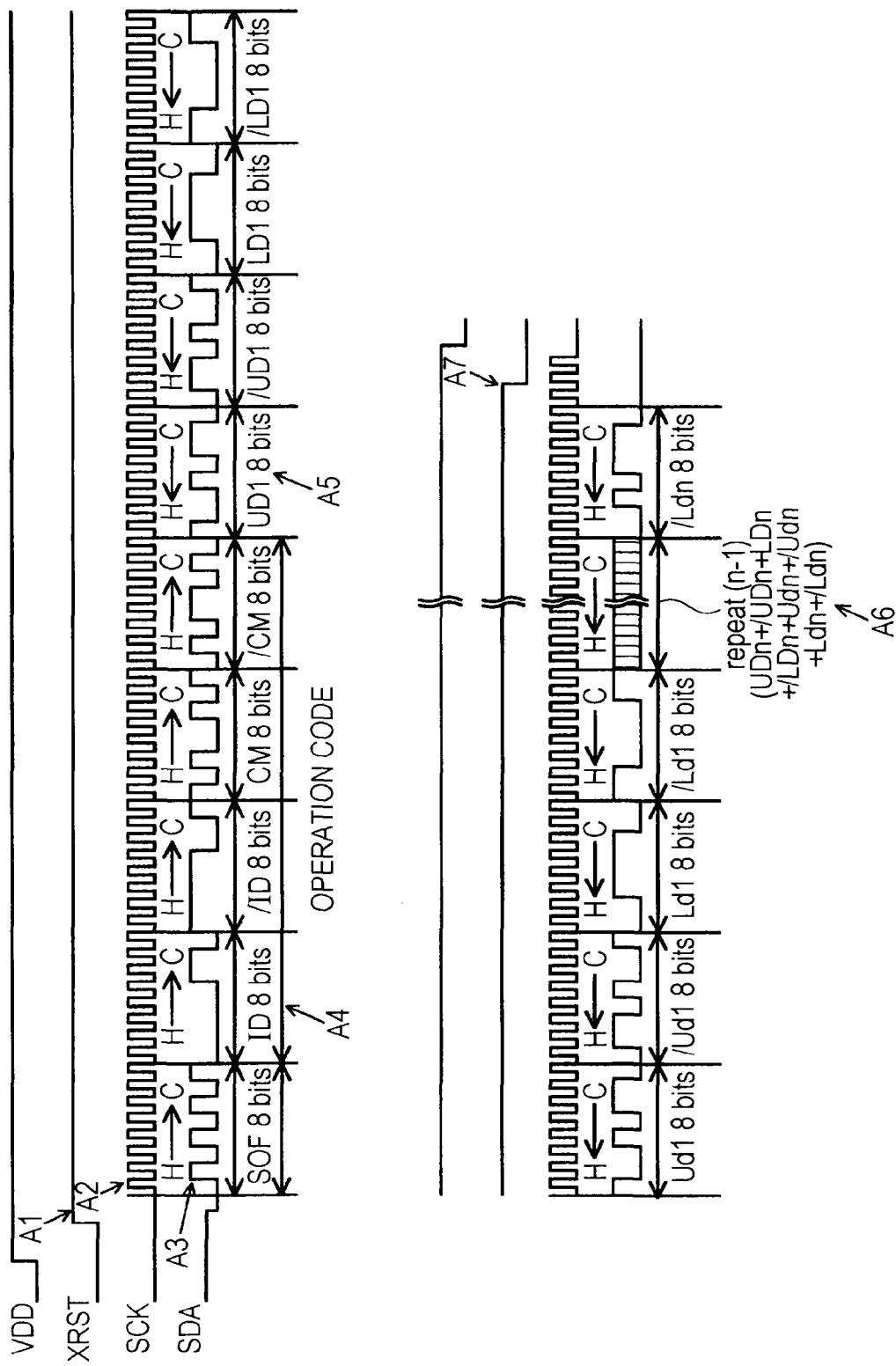
FIG. 17 is a view showing a signal waveform example in the case that data is read from the storage device.

The communication process section 312 performs the communication process between the storage device 20 and the main control section 300. Specifically, the reset signal XRST, the system clock SCK and the data signal SDA are supplied to the storage device 20 through the reset terminal THR, the clock terminal THK and the data terminal THD respectively. Thus, as described below as shown in FIG. 17 and the like, the serial communication process is performed to the storage device 20 by those signals. However, in the embodiment, the parallel communication process between the communication process section 312 and the storage device 20 may also be performed. Also, the communication process section 312 performs the transmitting/receiving the command or the data signal through the bus BS, so as to perform the communication process to the main control section 300. For example, the communication process section 312 determines the connection or non-connection between the ink cartridge 200 and the printer 10 or the communication error to the storage device 20, and transfers the determination result to the main control section 300.

The sensor process section 314 performs the determination process of the remaining amount of ink by the sensor 210. The sensor process section 314 applies the sensor driving signal DS from the main control section 300 to the electrode of the sensor 210 through the terminal THSN or THSP for driving the sensors. The sensor process section 314 determines whether the remaining amount of ink is equal to or more than the threshold or equal to or less than the threshold on the basis of the signal that is obtained by applying the sensor driving signal DS to the sensor 210. The determination result is transferred to the main control section 300 through the communication process section 312.

The main control section 300 performs the control of the printer 10. For example, the main control section 300 performs the control of the memory access, supplies the power supply voltage VDH or the ground voltage VSH to the sub control section 310 or performs the determination (the calculation process) of the remaining amount of ink. More specifically, the main control section 300 includes a control circuit 302 and a driving signal generation circuit 304.

The control circuit 302 transfers the command or data to the communication process section 312 through the bus BS and controls the communication process between the communication process section 312 and the storage device 20. Specifically, in the case that the connection of the ink cartridge 200 is detected by the communication process section 312, the data such as the remaining amount of ink or the like stored in the storage device 20 is read and the data such as the remaining amount of ink or the like that is newly computed on the basis of the data is written on the storage device 20. Also, the control circuit 302 controls the driving signal generation circuit 304 so that the sensor driving signal DS is supplied to the sensor 210. Thus, the control circuit 302 determines the remaining amount of ink on the basis of the determination result of the remaining amount of ink from the sensor process section 314 or assumed consumption amount of ink by the printing. In the case that emptiness of ink is determined, the information of the emptiness of ink may be displayed on the display section that is not shown in the drawings.

The storage device 20 includes the memory control circuit 30 (the control section) and the ferroelectric memory cell array 60 (the ferroelectric memory). The memory control circuit 30 includes the detection circuit 32, the masking control circuit 34, the ID comparison section 40, the command translation section 42, the address counter 44, the read/write control section 46, the data transmitter/receiver 38 (the transmitting/receiving section), the counter control section 48, the duplication data generation section 50, the inverse data generation section 52 and the data determination section 54 (the determination section). Also, the constituent which is identical with that of the above description with reference to FIG. 1 (for example, the masking process section) is expressed by the like numerals and are omitted appropriately.

The ID comparison section 40 compares the ID data (the identification data) that is received from the sub control section 310 with the ID number (for example, the number corresponding to the ink color) that is assigned to the storage device 20 so as to determine whether it is the object of the access or not.

The command translation section 42 translates the SOF (the communication start data), the command data and the EOF (the communication finish data) received from the sub control section 310, and determines the access start, the kind of access such as the read, the write or the like, and the finish of the access. The address counter 44 counts the system clock SCK, and thus outputs the count value for assigning the address (for example, the word line) of the ferroelectric memory cell array 60. The read/write control section 46 performs the control of the read/write to the ferroelectric memory cell array 60 on the basis of the kind of the access that was translated by the command translation section 42 or the count value of the address counter 44. The counter control section 48 (sequencer) counts the system clock SCK and controls the memory access on the basis of the count value and the command translation according to the command translation section 42.

The duplication data generation section 50 copies the original data that was read from the ferroelectric memory cell array 60 and thus generates the mirror data (the duplication data). The inverse data generation section 52 inverses (for example, inverse 0 to 1 and 1 to 0) each bit value of the original data that was read from the ferroelectric memory cell array 60 and generates the inverse data. The data determination section 54 performs the parity check of the original data and the mirror data or performs computation of the exclusive OR of the original data and the inverse data so that the conformability of the data is determined.

The ferroelectric memory cell array 60 is constituted by a plurality of the ferroelectric memory cells arranged along the word line and the bit line. The ferroelectric memory cell array 60 may include a row address decoder, a column address decoder, a sense amplifier and the like, not shown in the drawings.

12. Communication Process (Read Control)

As described above, the storage device of the embodiment stops the access control to the ferroelectric memory when the abnormal power supply state is detected. At this time, the printer needs to identify the floating state through the communication process with the storage device because it is not directly identified that the floating state was detected.

Hereinafter, the detailed description will be made regarding the communication process of the printer 10 and the storage device 20 using FIG. 17 to FIG. 22. FIG. 17 is a view schematically showing a signal waveform example in the case that data is read from the storage device 20. Also, in FIG. 17, the data transmitting/receiving direction is indicated by arrows. In other words, an arrow from H to C indicates that the sub control section 310 is in the transfer side and the storage device 20 is in the receiving side, and an arrow from C to H indicates that the storage device 20 is in the transfer side and the sub control section 310 is in the receiving side.

As shown in A1 in FIG. 17, when the communication process starts, the reset signal becomes from the low level to the high level. As shown in A2, the system clock SCK is supplied to the storage device 20. Thus, as shown in A3, the SOF (Start Of Frame) data as the data signal SDA is initially transferred to the storage device 20. As shown in A4, the ID data and the read command data as the operation code are transferred to the storage device 20. As the ID data, the original ID data and the inverse ID data /ID that have inversed each bit value of the original ID data (hereinafter, the inverse data is indicated as the slash symbol "/") are transferred to the storage device 20. As the command data, the original command data CM and the inverse command data /CM is transferred.

As shown in A5, the read data from the storage device 20 is transferred to the sub control section 310. As the read data, the high 8 bit UD1 of the 16 bit original data, the inverse data /UD1, the low 8 bit LD1 of the original data and the inverse data /LD1 are transferred. Also, the mirror data Ud1 of the UD1, the inverse data /Ud1, the mirror data Ld1 of the LD1 and the inverse data /Ld1 are transferred. The UD1, the LD1, the Ud1 and the Ld1 are data that were read from the storage device 20. Meanwhile, the /UD1, the /LD1, the /Ud1 and the /Ld1 which are the inverse data are the data generated by the inverse data generation section 52. As shown in A6, the read and the transfer of the above-described read data (unit read data) are repeated. As shown in A8, when the transfer of the read data finished, the reset signal becomes low level.

As described above, the data is multiplexed by the original data and the inverse data, so that the wrong operation of the storage device 20 is suppressed. For example, it can suppress that data of the nonvolatile memory is destroyed because the wrong command is received by the communication error and the wrong write or read is performed to the nonvolatile memory.

Now, as described above in FIG. 6 and the like, in the case that abnormal power supply state is detected, the system clock SCK is masked and the read/write control or the data transmitting/receiving is not performed. At this time, as the read data that is transferred to the printer 10, for example, the low level is output. Thus, the printer 10 can detect the floating state of the power supply terminal or the ground terminal as the communication process error.

Figure 18:
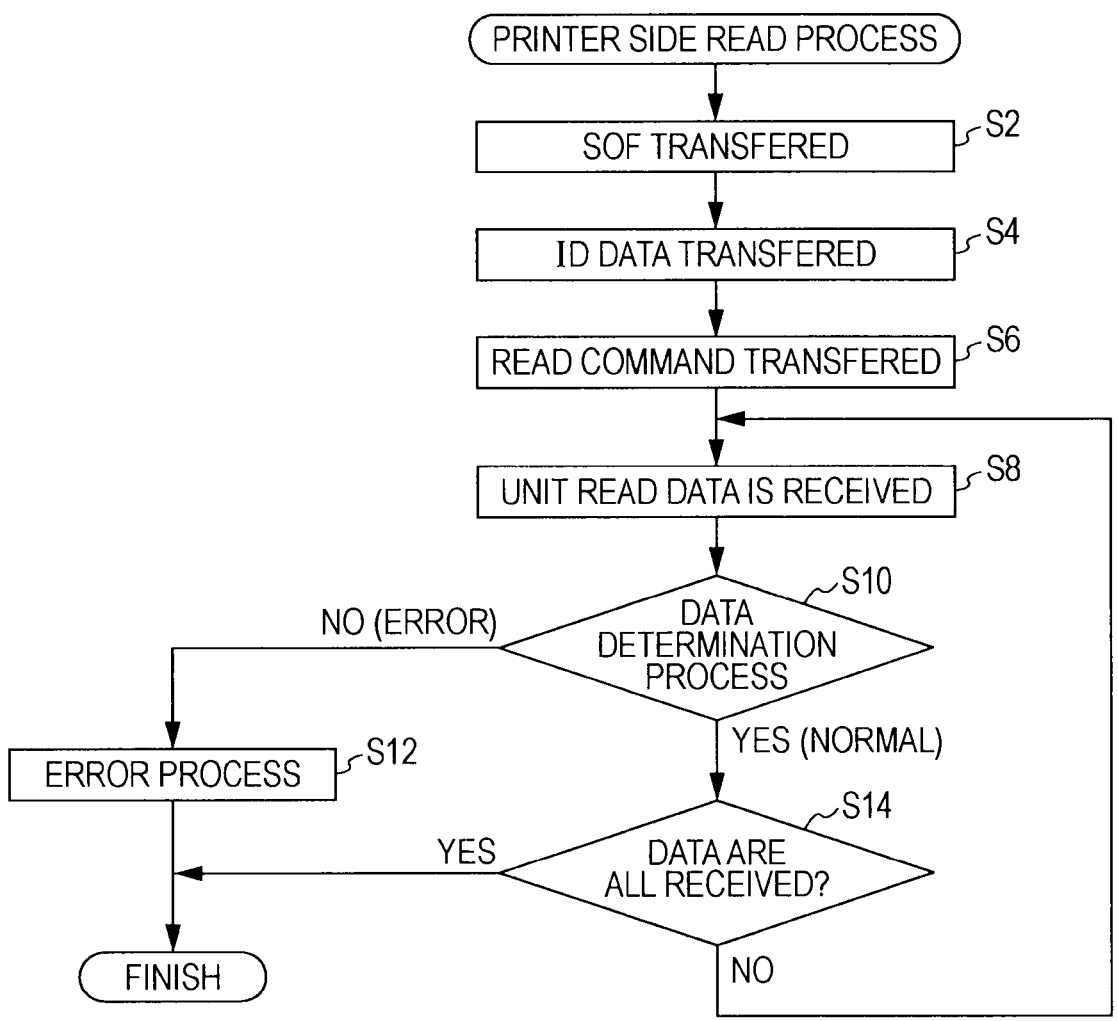
FIG. 18 is a flowchart example showing a read process of the printer.

FIG. 18 is a flowchart example showing a read process of the printer. As shown in FIG. 18, when the read process is started, the printer 10 transfers the SOF data (S2), transfers the ID data (S4), transfers the read command (S6) and receives the unit read data (S8). When the unit read data is received, the data determination process of the unit read data is performed (S10). In the case that the result of the data determination is error (N), the error process is performed (S12) and the communication process is finished. In the case that the result of the data determination is normal (Y), it conforms whether read data are all received (S14). In the case that the read data are all received (Y), the communication process is finished, and in the case that the read data are not all received (N), the unit read data is received (S8).

Also, in the data determination process (S10), for example, exclusive OR of the original data and the inverse data, or exclusive OR of the mirror data and the inverse mirror data, and exclusive OR of the original data and the inverse mirror data are computed. In the case that the read or the transmitting/receiving of the data is performed normally, each bit of those exclusive ORs becomes 1. In the data determination process, it determines the communication error or the memory cell error on the basis of the calculation result. And, in the error process (S12), for example, in the case of the communication error, the intent that the ink cartridge 200 is incorrectly mounted in the printer 10 is displayed on the display section of the printer 10.

Figure 19:
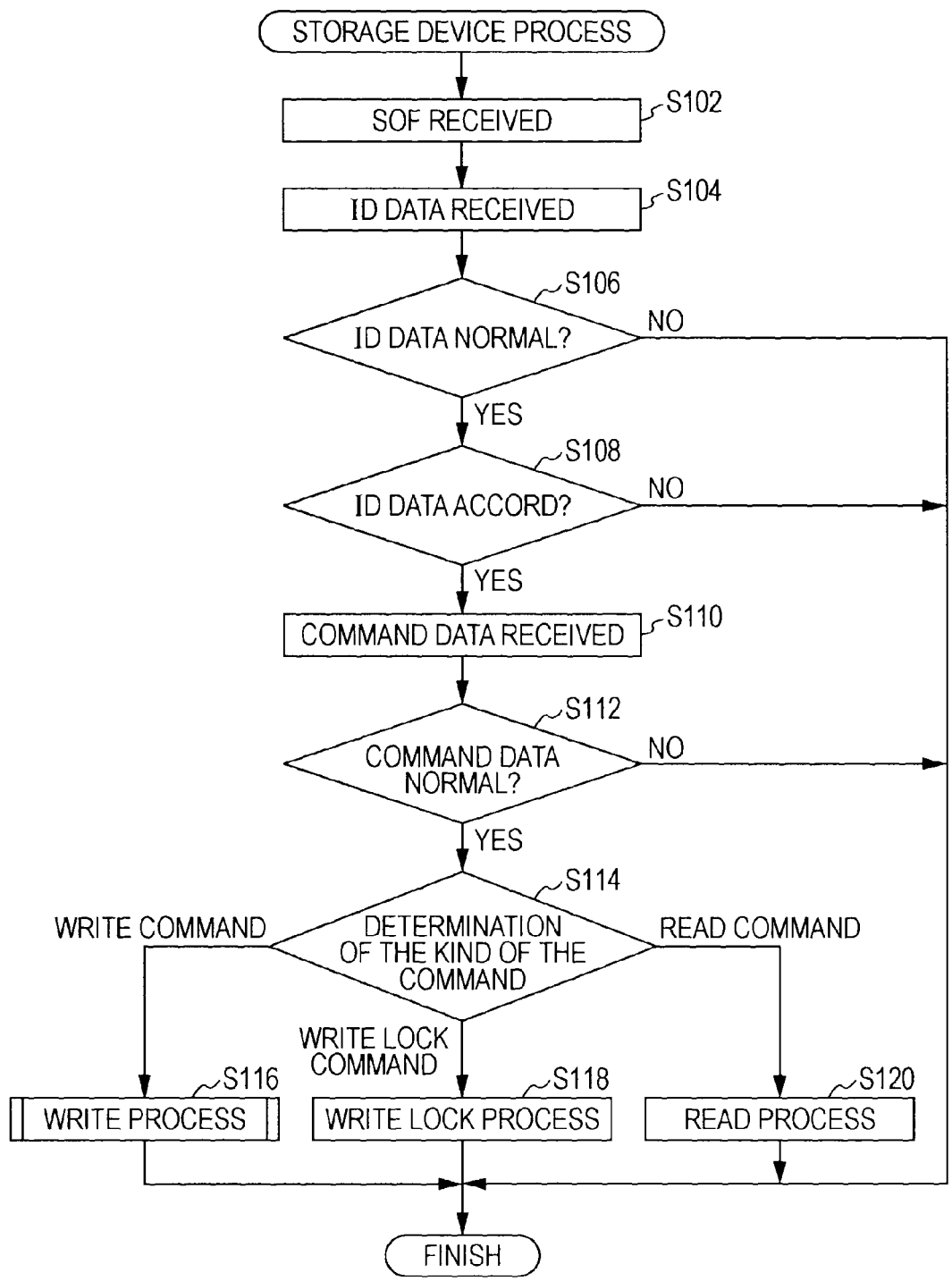
FIG. 19 is a flowchart example showing a read process of the storage device.

FIG. 19 is a flowchart example showing a read process of the storage device. As shown in FIG. 19, when the communication process is started, the storage device 20 receives the SOF data (S102), receives the ID data (S104), and determines whether the received ID data is normal or not (S106). In the case that the ID data is abnormal (N), the communication process is finished, and in the case that the ID data is normal (Y), it determines whether the ID data is accordant or not (S108). In the case that the ID data and the ID number of the storage device 20 is not accordant (N), the communication process is finished, and in the case that it is accordant (Y), the command data is received (S110). Thus, it determines whether the received command data is normal or not (S112). In the case that the command data is abnormal (N), the communication process is finished, and in the case that it is normal (Y), the kind of the command is determined (S114). In the case that the command is the read command, the read process is performed (S120), and the communication process is finished. In the read process, the read or the transfer of the original data or the like is performed and then the generation and the transfer of the inverse data are performed.

Also, in the case that the command is the write command, the storage device 20 performs the write process (S116) as described below with reference to FIG. 22 or the like. In addition, in the case that the command is the write lock command, the write lock process is performed (S118). In the write lock process, a process is performed that a part (or all) of the rewritable area of the ferroelectric memory 60 is set as an unwritable area. Specifically, it receives the address data followed by the write lock command. Thus, the area that was designated by the received address data is set to the write lock area. For example, the write lock area set the write flag in the control register so that it set as the row unit of the ferroelectric memory 60.

13. Communication Process (Write Control)

Figure 20:
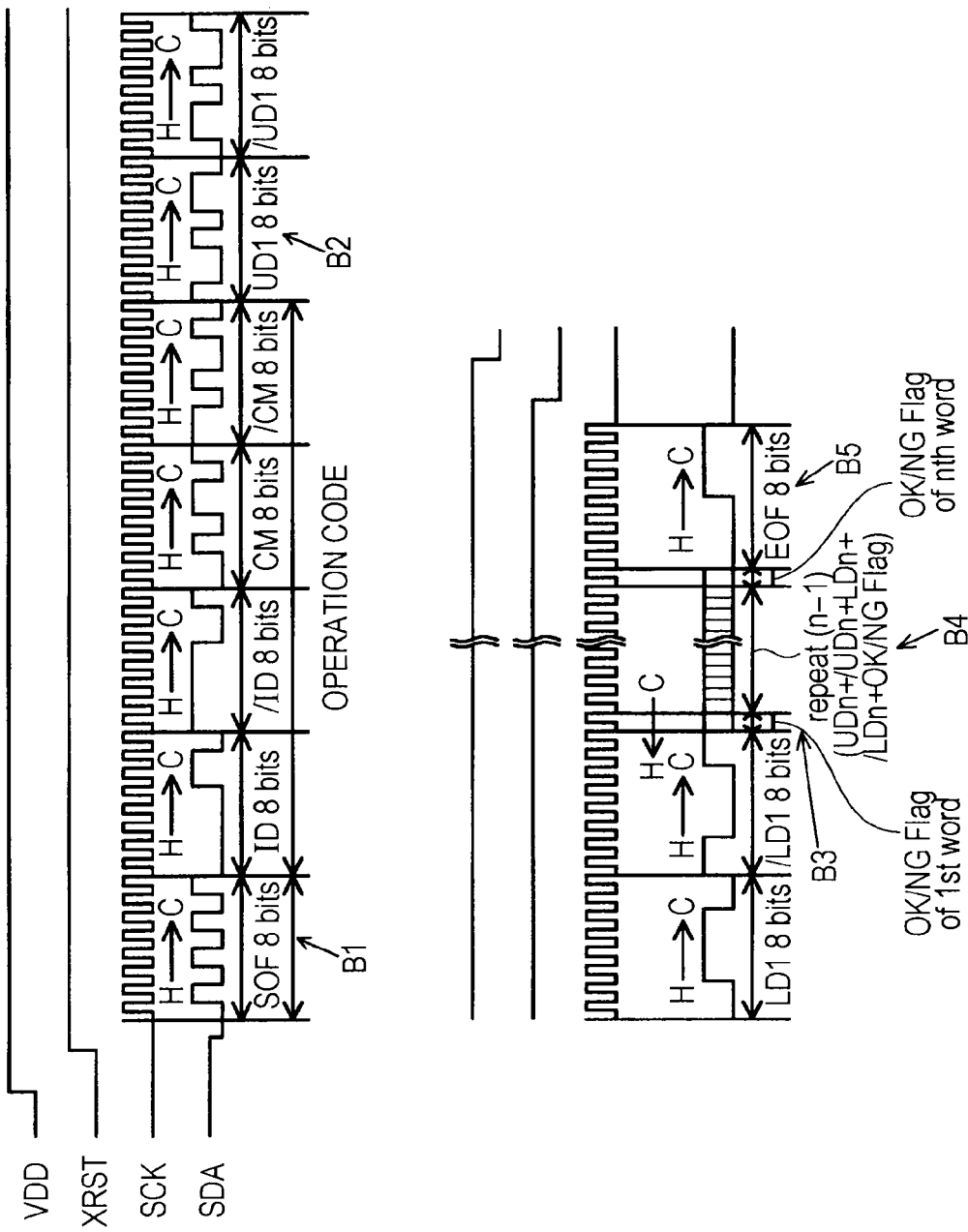
FIG. 20 is a view showing a signal waveform example in the case that data is written to the storage device.

FIG. 20 is a view schematically showing a signal waveform example in the case that data is written to the storage device 20. As shown in B1 in FIG. 20, the SOF data, the ID data ID, the inverse ID data /ID, the write command data CM and the inverse write command data /CM are transferred to the storage device 20. Thus, as shown in B2, as the write data, the high 8 bit UD1 of the 16 bit original data, the inverse data /UD1, the low 8 bit LD1 of the original data and the inverse data /LD1 are transferred. Also, the mirror data Ud1 of the UD1, the inverse mirror data /Ud1, the mirror data Ld1 of the LD1 and the inverse mirror data /Ld1 are transferred to the storage device 20.

As shown in B3, the storage device 20 determines whether the transferred data is normal or not, and OK/NG flag is transferred to the printer 10 on the basis of the determination result. For example, in the case that the data is determined in normal, the OK flag of the high level is transferred and in the case that the data is determined in abnormal, the NG flag of the low level is transferred. Thus, as shown in B4, the transfer of the above-described write data (the unit write data) and the transfer of the OK/NG flag are repeated. As shown in B5, when the transfer of the write data is finished, the EOF (End Of Frame) data is transferred to the storage device 20.

Now, in the case that abnormal power supply state is detected, the storage device 20 outputs (stop the transfer of the information of the determination result) low level as the data signal SDA for example. Thus, the printer 10 receives the low level (NG) as the OK/NG flag so that it may be determined as the communication error. Thus, printer 10 can detect the abnormal power supply state as the communication process error.

Figure 21:
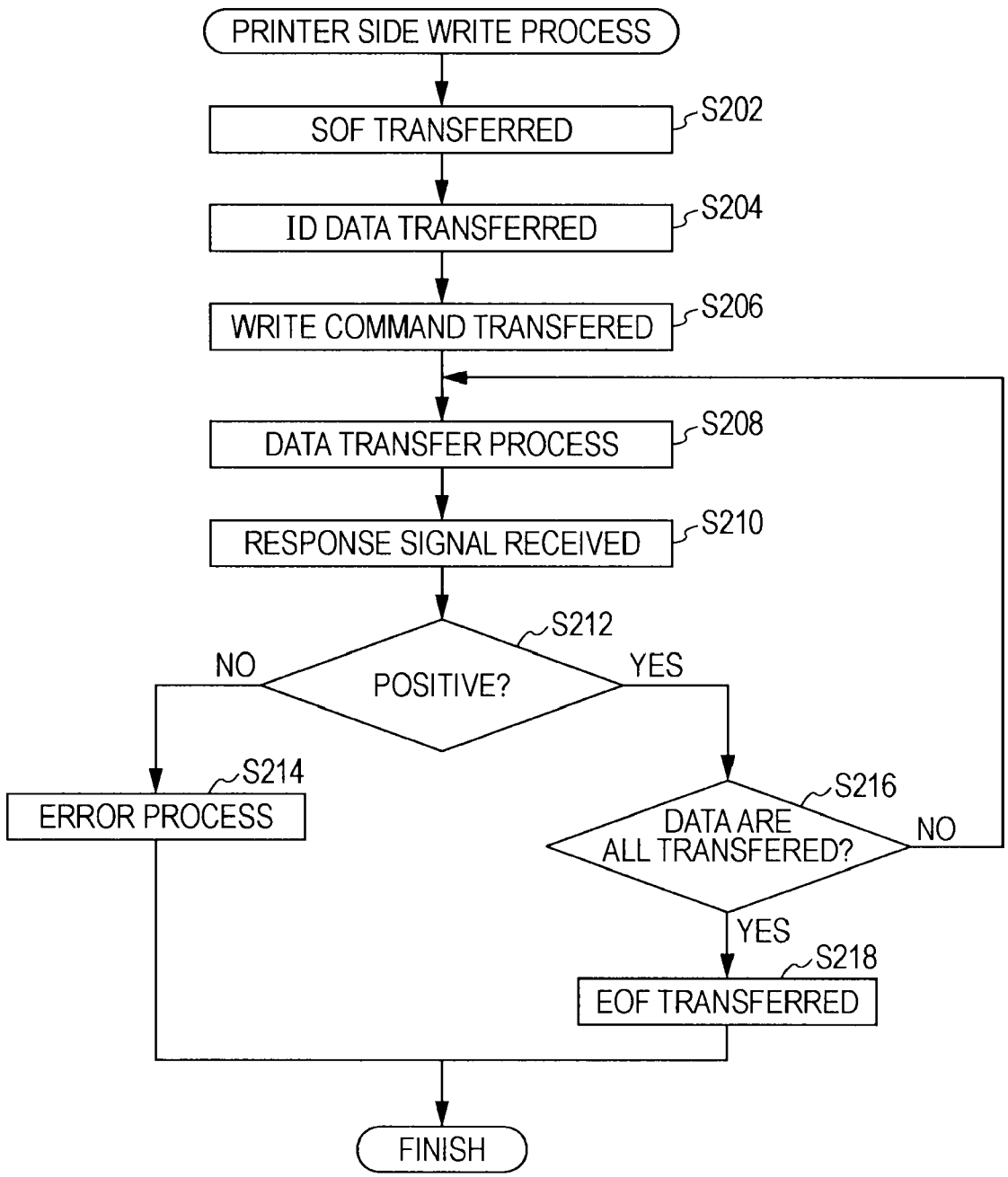
FIG. 21 is a flowchart example showing a write process of the printer.

FIG. 21 is a flowchart example showing a write process of the printer. As shown in FIG. 21, when the write process is started, the printer 10 transfers the SOF data (S202), transfers the ID data (S204) and transfers the write command data (S206). In addition, the unit write data is transferred (S208), receives the OK/NG flag (S210), and determines whether the received OK/NG flag is the OK flag or the NG flag (S212). In the case that the OK/NG flag is the NG flag (N), the error process is performed (S214) and the communication process is finished. In the case that the OK/NG flag is the OK flag (Y), it is determined whether the write data is all transferred or not (S216). In the case that the write data is all transferred (Y), the EOF data is transferred (S218), and the communication process is finished. In the case that the write data is not all transferred (N), it performs the process in which the unit write data is transferred (S208).

Figure 22:
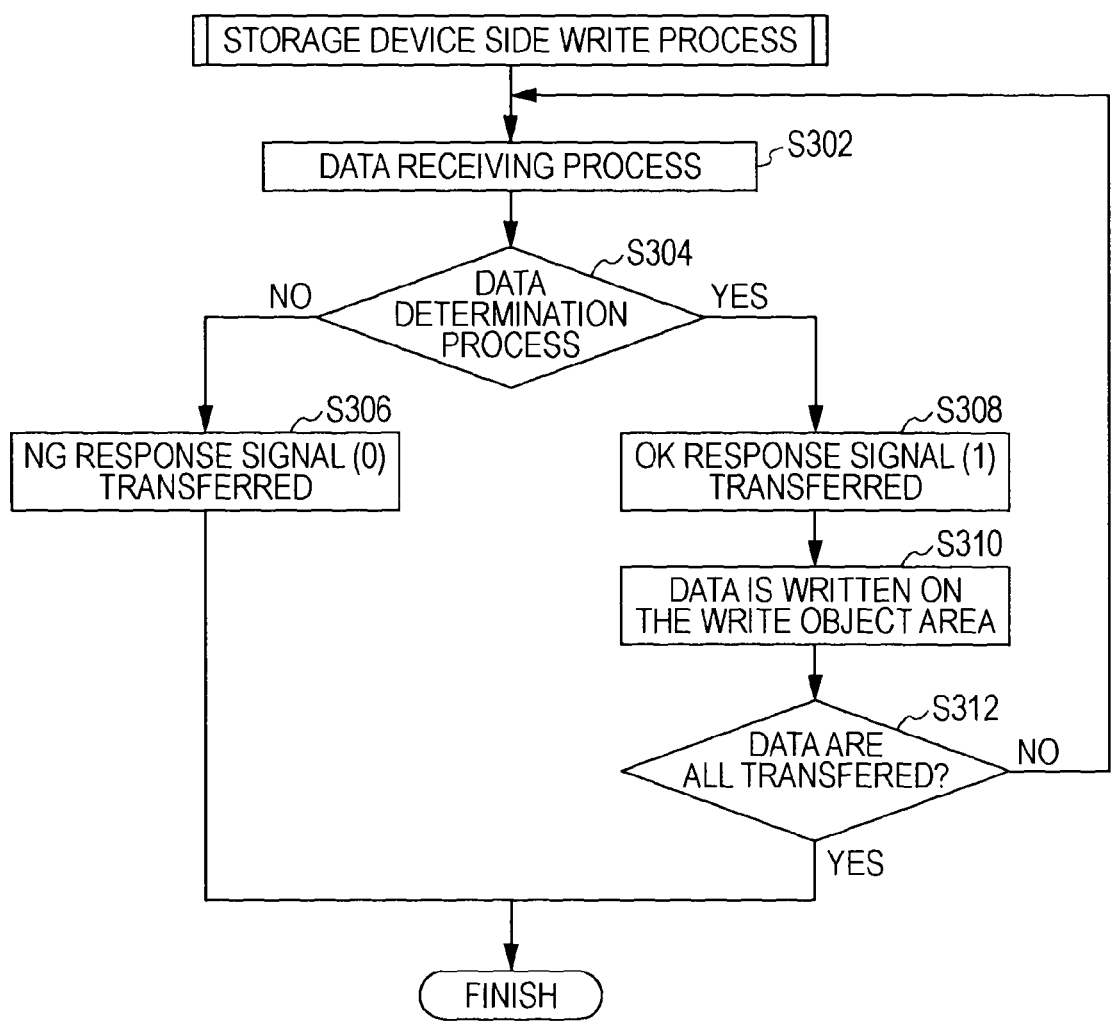
FIG. 22 is a flowchart example showing a write process of the storage device.

FIG. 22 is a flowchart example showing a write process of the storage device. As described above, referred to the FIG. 19 and the like, when the write command data is received, the storage device 20 performs the write process. As shown in FIG. 22, in the write process, it performs the process in which the unit write data is received (S302), and determines whether the received data is normal or not (S304). In the case that the write data is abnormal (N), the NG flag is transferred (S306) and the communication process is finished. In the case that the write data is normal (Y), the OK flag is transferred (S308) and the write data is written on the object area of the nonvolatile memory (S310). And, it determines whether the EOF data is received or not (S312), in the case that it receives the data (Y), the communication process is finished, and in the case that it does not receive the data (N), it performs the process in which the unit write data is received (S302).

While the embodiments have been described in detail above, it will be understood by those skilled in the art that a number of modifications can be made to the embodiments without substantially departing from the new matters and advantages of the invention. Therefore, it is to be noted that these modifications are all included within the scope of the invention. For example, terms referred to as being broader or other equivalent terms (the nonvolatile storage section, the substrate, the liquid container, the host device and the like) in the specifications and drawings can be replaced with the equivalent terms (the nonvolatile memory, the circuit substrate, the ink cartridge, the printer and the like) in any part of the specification and drawings. Also, the configurations and the operations of the control section, the nonvolatile storage section, the storage device, the substrate, the liquid container, the host device and the like are not limited to what have been described in the embodiment, and various modifications can be made thereto.

What is claimed is:

1. A storage device comprising:
    a nonvolatile storage section; and
    a control section that controls the nonvolatile storage section;
    wherein the control section including,
        an access control section that outputs a clock for access control for performing access control of a read/write of the nonvolatile storage section, and performs access control of the read/write to the nonvolatile storage section, and
        a masking process section that performs the masking process of a reset signal on the basis of the clock for access control from the access control section, and supplies the reset signal after the masking process to the access control section,
    wherein the masking process section includes
        a delay circuit that has a plurality of delay units, the delay circuit outputting a delay clock on the basis of the clock for access control from the access control section, and the delay circuit outputting an output clock to the nonvolatile storage section for access control on the basis of the clock for access control from a middle tap of the plurality of delay units, and
        an output circuit that outputs the reset signal after the masking process on the basis of the clock for access control and the delay clock from the plurality of delay unit.

2. The storage device according to claim 1, wherein the reset signal from a host device is supplied to the reset terminal that is connected to a host side reset terminal, and
    wherein the masking process section performs the masking process of the reset signal from the reset terminal.

3. The storage device according to claim 1, wherein the masking process section outputs an output clock for access control corresponding to the clock for access control to the nonvolatile storage section on the basis of the clock for access control, and performs a masking process in which the reset signal after the masking process is made to be a non-active without depending on the voltage level of the reset signal, in masking period from a first timing that is before an edge timing of the output clock to a second timing that is after the edge timing.

4. The storage device according to claim 3, wherein the masking process section makes the edge timing of the clock for access control to be the first timing so as to perform the masking process, and outputs the output clock in which the clock for access control is delayed only by a time shorter than the masking period.

5. The storage device according to claim 3, wherein the period from the first timing to the edge timing in masking periods is a period corresponding to a setup time in which at least one of a data and an address in the nonvolatile storage section is latched, and
    the period from the edge timing to the second timing in masking periods is a period corresponding to a hold time in which at least one of the data and the address in the nonvolatile storage section is latched.

6. The storage device according to claim 1, wherein the delay circuit sets a tap position of the middle tap on the basis of the setup time and the hold time in which at least one of the data and the address in the nonvolatile storage section is latched.

7. The storage device according to claim 1, wherein the access control section performs the masking process in which the reset signal after the masking process is made to be non-active without depending on the voltage level of the reset signal in masking period.

8. The storage device according to claim 7, wherein the nonvolatile storage section is a ferroelectric memory, and
    wherein masking period is set to be a period of a length that secures the read operation and the rewrite operation in access control of the read in the ferroelectric memory.

9. The storage device according to claim 1, wherein the control section has a detection circuit that detects an abnormal power supply state of a power supply voltage which is supplied by the host device, wherein the access control section stops access control of the read/write to the nonvolatile storage section in the case where the abnormal power supply state is detected by the detection circuit, and completes access control of the read/write in an access cycle without stopping in the case where the abnormal power supply state is detected by the detection circuit after the start of the access cycle, and wherein the masking process section performs the masking process of the reset signal on the basis of the clock to perform access control of the read/write.

10. A substrate comprising the storage device according to claim 1.

11. A liquid container comprising the storage device according to claim 1.

12. A system comprising:
the storage device according to claim 1; and
a host device.

* * * * *